United States Patent [19]
Spinner

[11] Patent Number: 5,808,259
[45] Date of Patent: Sep. 15, 1998

[54] THICK FILM APPARATUS AND METHOD FOR CUSTOMIZING IC TEST PCB

[76] Inventor: Howard Spinner, 16456 Hilow Rd., Los Gatos, Calif. 95032

[21] Appl. No.: 651,411

[22] Filed: May 22, 1996

Related U.S. Application Data

[63] Continuation-in-part of Ser. No. 509,389, Jul. 31, 1995, abandoned.

[51] Int. Cl.⁶ .................................................. B23K 11/16
[52] U.S. Cl. ......................................................... 219/56.22
[58] Field of Search .................. 219/56, 56.1, 56.21, 219/56.22; 361/748, 751, 761, 777

[56] References Cited

U.S. PATENT DOCUMENTS

| | | | |
|---|---|---|---|
| 4,622,106 | 11/1986 | Kitagawa | 204/15 |
| 4,627,678 | 12/1986 | Biswas | 339/17 CF |
| 5,358,622 | 10/1994 | Korsten | 205/125 |
| 5,465,927 | 11/1995 | Chun-Jung | 248/271 |
| 5,526,974 | 6/1996 | Gordon et al. | 228/103 |

*Primary Examiner*—Matthew V. Nguyen
*Attorney, Agent, or Firm*—Donald R. Boys

[57] ABSTRACT

Methods for customizing printed circuit boards (PCBs) are provided, comprises steps for applying conductive jumper strips between pin pads and power lands or ground planes of the PCB. In all embodiments, basic PC boards are a starting point, and the basic boards are customized by providing jumpers at customer-specified locations. In one embodiment the jumpers are applied through a template by conductive polymer material. In another embodiment jumpers are welded using a gold foil strip and a PCB repair station. In another embodiment, jumpers are transferred to a load board from a laminate wherein jumpers have been cut out in one layer. In yet another embodiment, a load board is covered with a peelable solder mask material except where jumpers are wanted, then electroless or electrode plating techniques are used to plate up jumpers.

11 Claims, 21 Drawing Sheets

THICK FILM APPARATUS AND METHOD FOR CUSTOMIZING IC TEST PCB

CROSS-REFERENCE TO RELATED DOCUMENTS

This application is a continuation-in-part of application Ser. No. 08/509,389, now abandoned, filed Jul. 31, 1995, which is incorporated herein in its entirety by reference.

FIELD OF THE INVENTION

The present invention is in the area of methods and apparatus for testing integrated circuits (ICs), and pertains more particularly to customizing power and ground connections on printed circuit boards (PCBs) called load boards in the art, wherein the load board provide conductive paths for signals, power, and ground to sockets for testing ICs.

BACKGROUND OF THE INVENTION

At the time of the present invention, integrated circuits (ICs) in a wide variety of sizes and for a wide variety of purposes have been developed and commercialized. ICs are typically rectangularly shaped dies, also called chips, of semiconducting silicon upon which solid state transistors and interconnecting circuitry have been constructed, and connection to off-chip circuitry is provided through contact leads and bonding pads arranged around a periphery of such a chip.

To protect an IC die and to provide a standard physical interface to, for example, a printed circuit board, such die are typically encapsulated in plastic or ceramic material with wires bonded to bonding pads on a die and to conductive leads leading away from the die. The conductive leads are ultimately soldered to electrical traces on a printed circuit board for use in any one of many electronic applications.

It has been a trend in the art to accomplish increased device density and smaller circuitry dimensions in ICs, to provide more circuitry in a smaller space. There is a trend as well to accomplish increased speed at which an IC operates. As ICs become more complex and powerful as a result, thorough testing of many thousands (sometimes millions) of transistors and miles of interconnective traces has become ever more critical. Typically, an effort is made to test every transistor and every connection of an IC to assure proper operation.

The present invention is in the area of test apparatus for testing ICs. In following descriptions and discussions, ICs to be tested and under test will be referred to generally as device-under-test (DUT), as is common in the art.

Partly because of a trend to smaller die and to more contacts to the outside world from an IC, reliably connecting bonding pads on a die to perform thorough testing is not a simple exercise. Because of this, most ICs are tested after packaging, although in some cases ICs are tested before packaging, and even before individual ICs are separated from semiconductor wafers upon which they are constructed. Methods are also being developed to mount ICs on circuit boards without packaging.

The IC testing process is historically one of placing a packaged IC in a test socket, with leads of the IC making electrical contact with contact pads or lands in a socket. In present art, a computerized tester, to be more fully described below, comprising a CPU, power supply, suitable memory, and control routines developed for testing an IC, provides test vectors, power, and ground connections through an interface harness to a test head. In a test head, power, ground, and vector signal lines are interfaced through a somewhat complex distribution system, which includes pin electronics boards, and provided finally to leads of a DUT placed in a test socket connected to a load board.

Typically, each individual DUT has a dedicated set of software control routines to be executed on a tester to provide a serial stream of test vectors for a DUT. There will also typically be an especially designed and constructed load board for a unique type of DUT, and a specific socket interfaced to a load board, and a particular power and ground connection to suit the unique configuration of the DUT.

In design and development of an IC, information is also used to develop software for testing ICs manufactured according to a particular design. A customized load board and a customized socket is also typically developed. One may have, for example, a batch of 100 packaged ICs of a particular design to be tested. To prepare to test these devices, a customized load board is assembled to a test head. A test socket, with connections configured to meet appropriate leads on a DUT, is assembled to the board, and customized software for that DUT is loaded into a test system.

After a test apparatus is customized to a DUT and a dedicated software is loaded, the 100 DUT's are installed and removed serially, with a test vector set applied to each in order. Typically, if a DUT fails, a test system reports the failure. After the 100 devices are tested, much of a test system (tester, software, load board, socket) is reconfigured for a new batch of DUT types to be tested. Test systems are sometimes manual, and sometimes complex material handling systems may be interfaced to a test system for presenting DUTs to a tester.

The shape and size of IC packages varies, the number of leads varies from type to type, the size and geometry of leads varies, the position of leads where the power supply voltages and grounds must be applied differs from type to type, and so on. Different standard packages are given names, such as dual in-line package (DIP) and quad flat package (QFP). In current art, load boards are designed and manufactured to fit a unique configuration of each DUT.

In many cases, although a single load board may be able to serve a variety of different DUTs having a common package configuration and lead geometry and configuration, power connections and ground lead locations will vary. Load boards, in these cases, have to be configured somehow so power supply and ground connections match with connective requirements of a unique DUT.

In some instances, user's prefer a completely customized board, so power and ground connections terminate at points aligning with socket connections. This is a relatively expensive solution, requiring an entirely different, fully customized board for each DUT, even if several devices to be tested have a common size and lead configuration and can be interfaced to a common socket.

An alternative solution is to bring signal leads to all lead positions at an interface area on a load board, and to provide power and ground points or pads nearby each lead position. Then power and ground may be jumpered to appropriate points at the interface according to the unique requirements for each DUT. In this manner, a common load board may be provided for a large number of DUTs, and customizing is done on the common board by one or another finishing technique.

One method of finishing and customizing a load board of the type described above, involves hand-soldering a solder bridge or a jumper wire from power and ground locations nearby, to pads contiguous with through-holes to which socket or receptacle pins may be mounted. That is, given a pattern, for example, of through-holes on a load board to which pins of a receptacle or a socket will be engaged, the through-holes typically corresponding to the leads of a DUT, one simply provides a jumper one-at-a-time to each through-hole for a pin requiring power or ground.

There are some problems inherent in soldering on such a load board, however. Plated through-holes and solder pads on a load board are typically very small and necessarily closely-spaced. This makes such a soldering process, either with or without jumper wires, time-consuming, costly, and somewhat risky. Such solder connections must be very carefully made on a board that may represent a several thousand dollar investment, without damaging plated through holes, contact pads, or surface of the load board. An improper connection or damaged test surface may mean a scrapped board and costly delays.

A new apparatus and method for customizing load boards quickly, inexpensively, and without risk of loss and delay is clearly needed.

For those leads of a DUT that require power, it is conventional in the art that a power connection be made to each such lead, and, during testing each of these leads is typically hot. Still, during testing, depending on the test vectors provided, the power draw on each such lead varies. At various times a relatively sudden demand for increased power may be made on one lead or another, or on all power leads at the same time.

When a demand for power is relatively sudden, due to multiple junctures and often necessarily small cross-section of conductive paths for power from a power supply to final connection to leads of a DUT, it has become a practice to provide decoupling capacitors near each power lead connection, with one end of the capacitor connected as close as is practical to the power lead, and the other connected to ground. These decoupling capacitors are typically and conventionally mounted between plated through holes and a ground plane on the backside of a load board; that is, the side opposite the side where a receptacle and a test socket are mounted.

To provide the best possible decoupling for power leads, closer coupling of capacitors to power leads is needed.

SUMMARY OF THE INVENTION

In a preferred embodiment of the present invention a method is provided for customizing a printed circuit board (PCB), comprising steps of (a) registering a template to the PCB, the template having an opening in registration defining a position between a first and a second conductive land on the PCB where a conductive trace or jumper is desired; (b) marking through the opening in the template with a marking tool; (c) removing the template, leaving the PCB marked at a position where a jumper is wanted; (d) placing a conductive foil strip at the position marked; and (e) welding the conductive foil strip to the first and the second conductive lands. The method can be used for multiple jumpers. Welds are preferable accomplished by passing an electrical current between two electrodes spaced apart in a first direction and both contacting the foil strip over a conductive land, the electrical current passing through the foil strip and a portion of a surface of one of the conductive lands.

In typical apparatus the spaced-apart electrodes comprise a weld tip having a length dimension in the direction between the electrodes and a width at right angles to the length, the length being greater than the width. Preferable some welds are made with the length of the weld tip at substantially ninety degrees to the length direction of the jumper strip to conserve land space where welds are accomplished.

In another embodiment a method is provided for customizing a printed circuit board (PCB), comprising steps of (a) forming jumper strips as isolated regions of conductive material on a one-piece backing material, the isolated regions affixed to the backing material by a first adhesive, and having a second adhesive stronger than the first adhesive on a surface of the jumper strips opposite the backing material; (b) placing the backing material over the PCB with the jumper strips at positions where jumpers are desired; (c) pressing the jumper strips onto the PCB such that the second adhesive affixes the jumper strips to the PCB; and (d) peeling away the backing material, leaving the jumper strips on the PCB. The conductive material is preferably gold. Also in a preferred embodiment the isolated regions of conductive material are formed on the backing material by an automatic machine responding to software including data on jumper strip positions desired on the PCB.

In yet another embodiment a method is provided for preparing a printed circuit board (PCB) for application of jumpers between lands on the PCB is provided, comprising steps of (a) forming jumper strip stencils as isolated regions of material on a one-piece backing material, the isolated regions affixed to the backing material by a first adhesive; (b) placing the backing material over a silkscreen; (c) pressing the jumper strip stencils onto the silkscreen such that the stencils adhere to the silkscreen; (d) peeling away the backing material, leaving the stencils on the silkscreen; (e) positioning the silkscreen on the PCB such that the stencils on the silkscreen cover regions where jumpers are desired; (f) applying a peelable solder mask material to the silkscreen; (h) removing the silkscreen, leaving the regions covered by the stencils exposed with no solder mask material; and (i) curing the peelable solder mask material.

In further embodiments the method comprising peelable solder mask material is extended to making jumper strips by (j) rendering the surface of the PCB conductive in the regions exposed through the peelable solder mask material, and; (k) plating the regions rendered conductive in a plating bath to form conductive jumpers in the exposed regions. The plating material is preferably gold. In one instance the surface of regions on the PCB where jumpers are desired is rendered conductive by a sputtering process.

These processes provide a system for very quickly responding to a customer's need for a customized load board in IC testing, because basic boards with pin patterns and the like for socket assembly can be stocked, and it is only necessary to finish the jumpers of ground and power to specific pins as specified by the customer to finish a customized board. Moreover, the system is less expensive than conventional systems for providing customized boards.

DESCRIPTION OF THE PREFERRED EMBODIMENTS

Figure 1A:
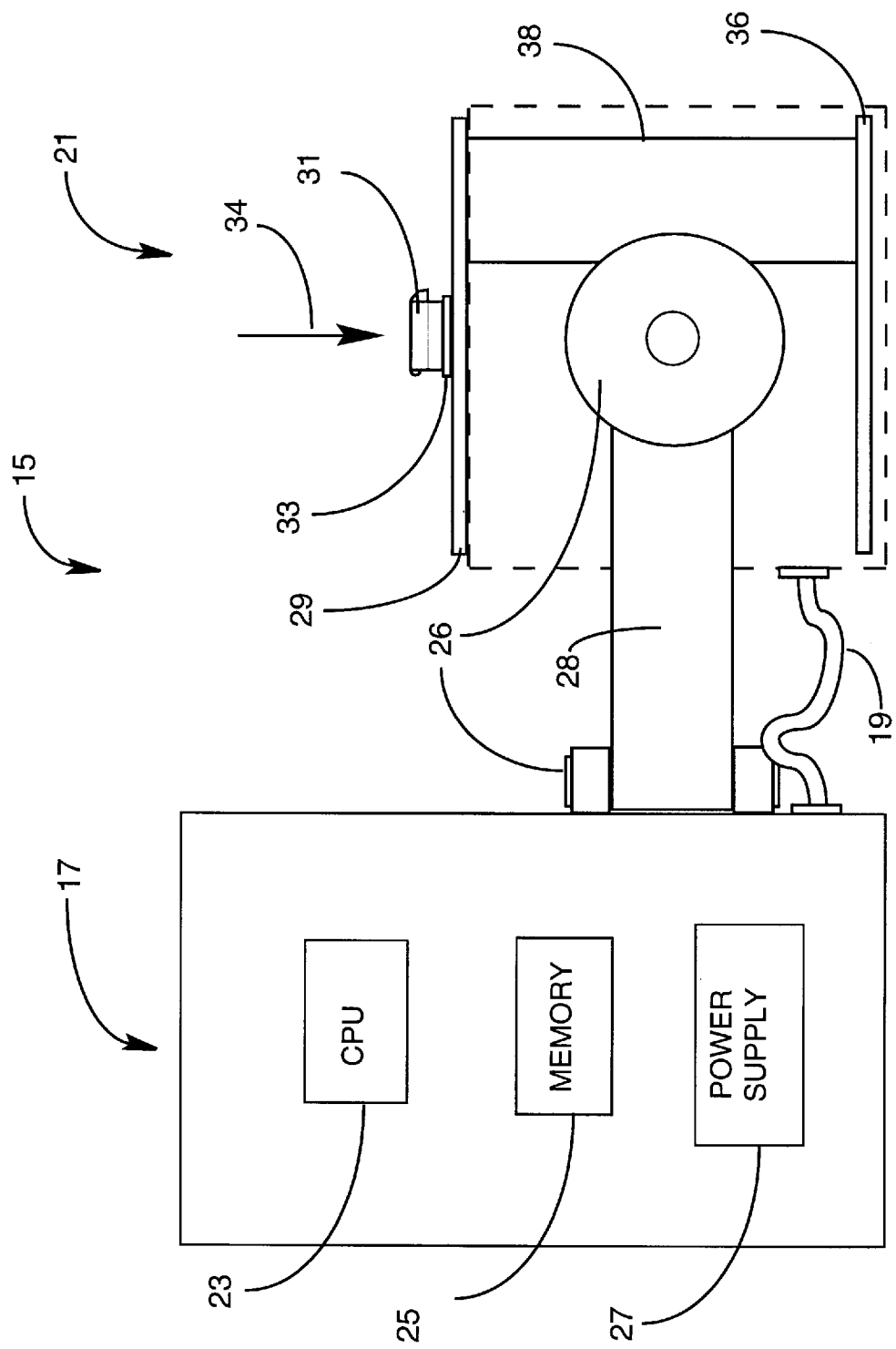
FIG. 1A, labeled prior art, is a representative illustration of a conventional IC test system 15 as known in the art.

FIG. 1A is a mostly block diagram of an IC test system 15 as known in the art. The system includes a computerized tester 17 connected by a cable bundle 19 to a test head 21. In actual systems there may be several cable bundles for the large number of conductors required from a tester to a test head.

Tester 17 generally comprises a computer processing unit (CPU) 23 for managing functions, a memory 25 for storing variable information and control routines, and power supplies 27 for supplying electrical power at appropriate voltage and current capacity to elements of the computerized tester, and also to test head 21. An interchangeable load board 29 is coupled to various conductors in cable bundle 19 from computerized tester 17 through mother board 36 and pin electronics boards 38 in test head 21. Load board 29, which is typically a multi-level board because of the large number of signals carried to a DUT for testing, serves as an interface to a socket 31 wherein a DUT is engaged for test. In conventional art, test head 21 is typically mounted on gimbals 26 and connected to computerized tester by bracket 28, or to a test stand, so test head 21 can be manipulated to allow test head 21 to mate with automated DUT loaders to facilitate IC testing.

There are various ways in the art that sockets are mounted to load boards in the type of test equipment described with reference to FIG. 1A. In some instances a socket may be mounted to the load board DUT test site, described in more detail below, by means of an intermediary receptacle 33, which is soldered to be semi-permanently mounted to the load board DUT test site, and has pins enabling sockets to be plugged into the receptacle and interchanged as necessary. In other instances, sockets are soldered directly to load board DUT test site.

Figure 1B:
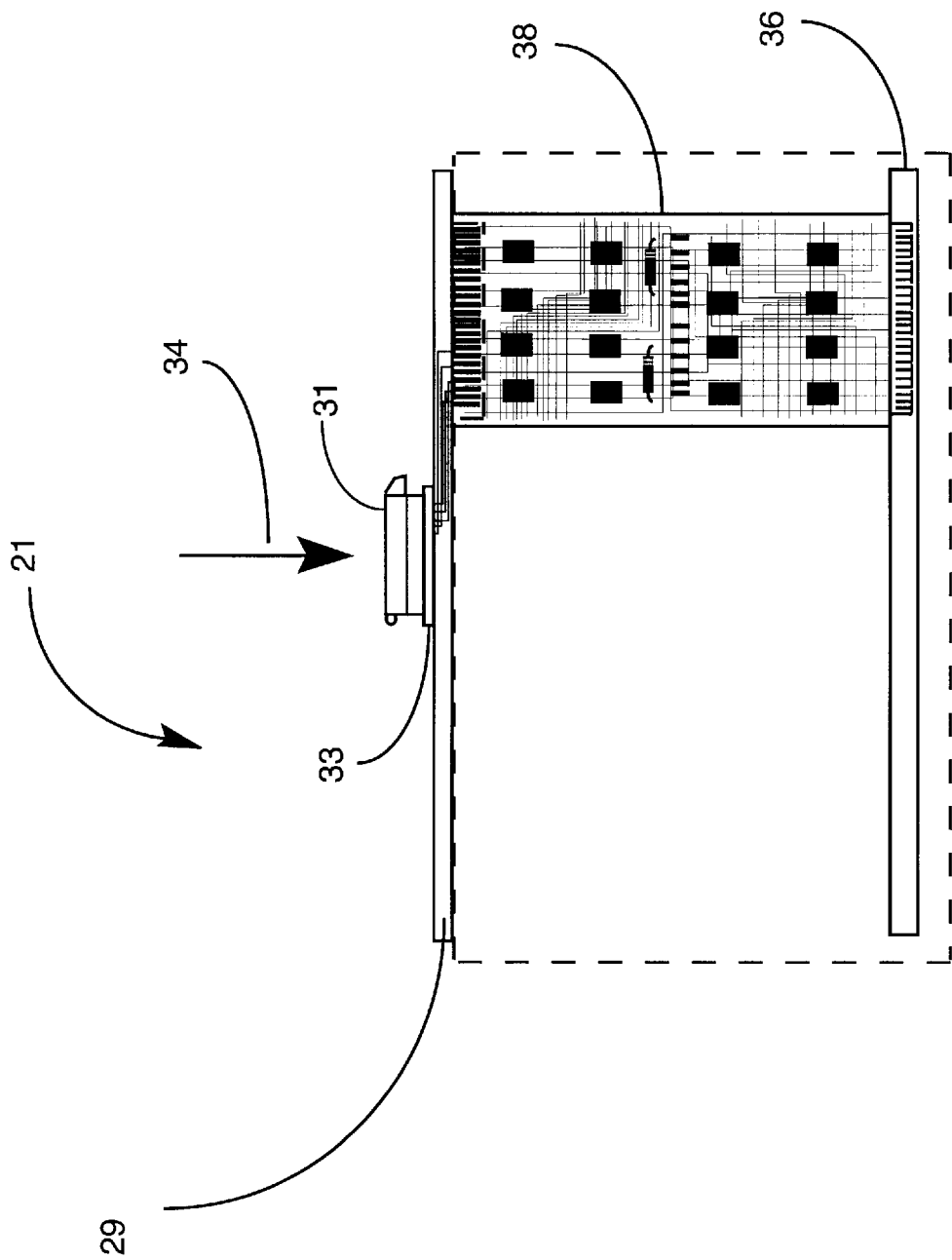
FIG. 1B, labeled prior art, is an illustration of a test head showing further detail.

FIG. 1B is a mostly block diagram showing more detail of test head 21, including a test head motherboard 36, which allows connection of test vectors to pin electronics cards 38. The pin electronics cards condition and route test vectors to load board 29, which is a multi-layered module board connecting test vectors, power supply voltages and ground connections to DUT socket 31 through intermediary receptacle 33. Only one pin electronics board 38 is shown here for simplicity of illustration, but there are typically several such pin electronics boards configured similarly, to perform a variety of tasks in conditioning test signals and the like. Only one test head is shown, but several test heads may be connected to a computerized tester 17, depending on testing requirements.

Intermediary receptacle 33 is shown here as one way to connect DUT test socket 31 to a test area on load board 29. Other methods may include soldering DUT socket 31 directly to a DUT test site, eliminating the need for intermediary receptacle 33 but making DUT socket 31 replacement on a given load board 29 impractical and costly.

Figure 2A:
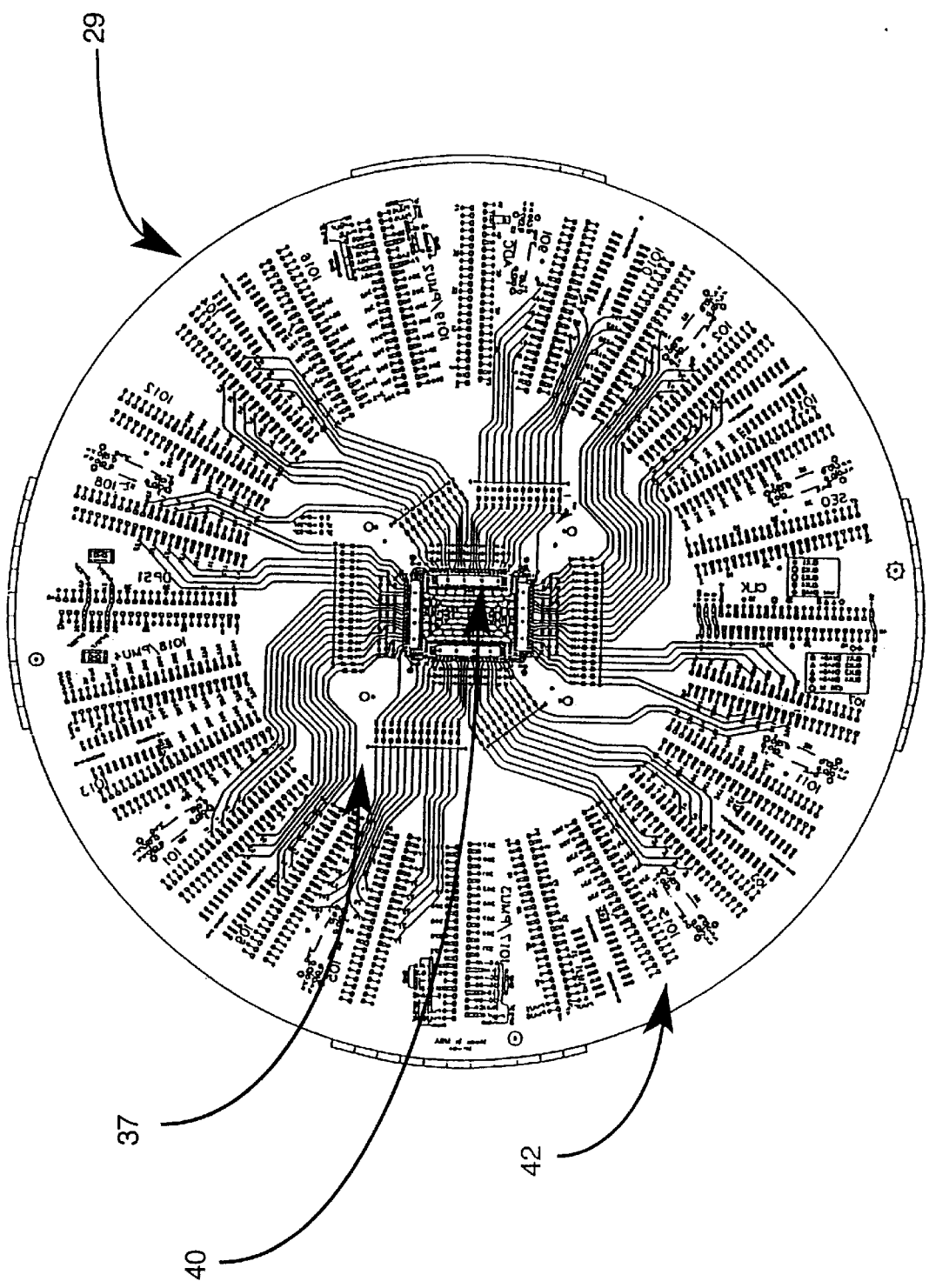
FIG. 2A, labeled prior art, is a plan view of a load board.

FIG. 2A is a plan view of load board 29, showing the opposite side, or underside, of the load board from the vantage point of arrow 34 in FIG. 1A and FIG. 1B. On this side of load board 29 there are typically contact points 42, to which pogo pins, or other means of connection well known in the art, interface with pin electronics boards 38 to establish power, ground, and vector signal connections to the rest of a test system 15 apparatus.

In center area 37 of board 29 there is a DUT test site 40, where through-holes are provided for engaging pins of either an intermediary receptacle or a test socket. As is well known to those with skill in the art, not all load boards are round, not all interface between a load board and a test head couple with pogo pins, and there are numerous alternatives to the typical and conventional apparatus and architecture shown here.

Figure 2B:
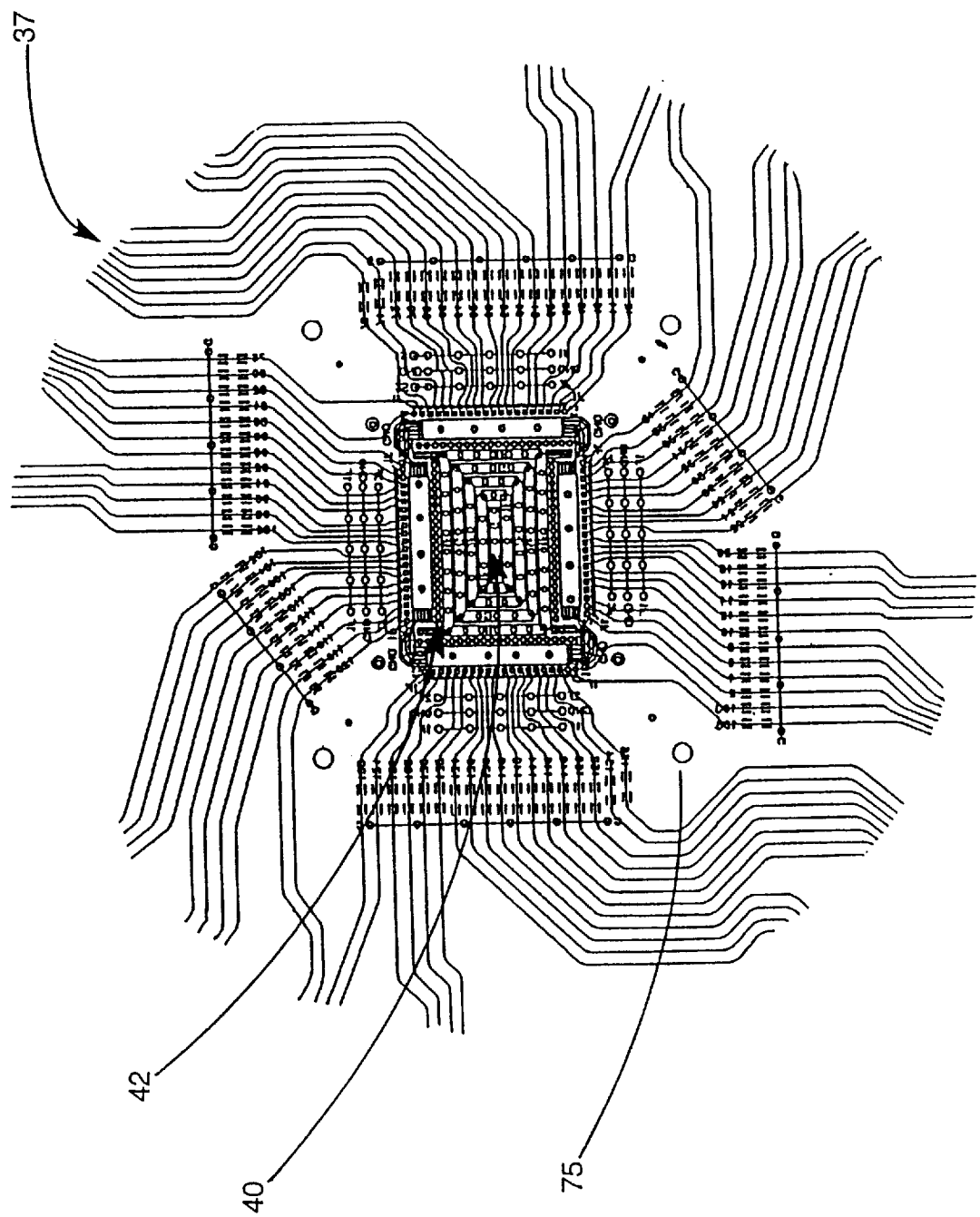
FIG. 2B, labeled prior art, is an enlarged plan view of the load board of FIG. 2A.

FIG. 2B is an enlarged plan view of a generally center area 37 of load board 29, which includes DUT test site 40. In this particular board fixture mounting holes 75 are provided as precision drilled holes which may be used for various purposes. In FIG. 2B, parallel rows 42 of plated through holes are shown arranged in a rectangular pattern near the center of the board. It is generally to these plated through holes that mounting pins of either a socket or a receptacle are engaged to the topside of load board 29.

The very large number of signal lines and other lines that must be brought to a DUT dictate the complexity shown, and it must also be remembered that, in many cases these are multi-level boards, wherein many signal lines, or power and or ground planes, are provided in the interior levels of the board. Six level boards, for example, are common in the art, and it is common to provide power and ground planes so a sufficient mass or cross-sectional area of conductor may be provided, considering the long distance from the power supplies in computerized tester 17 (FIG. 1A).

In the case of power and ground requirements, wherein the power and ground conductors typically originate in computerized tester 17, pass through test head 21 and through buried signal, voltage, and ground conductors and planes in load board 29, contact is brought to the surface of the board, as is well known in the art, by use of plated through holes. Signal lines are typically, but not necessarily provided as traces on the outside layers of the load board. Termination on the load board for these signal lines is also typically at plated through holes.

Figure 2C:
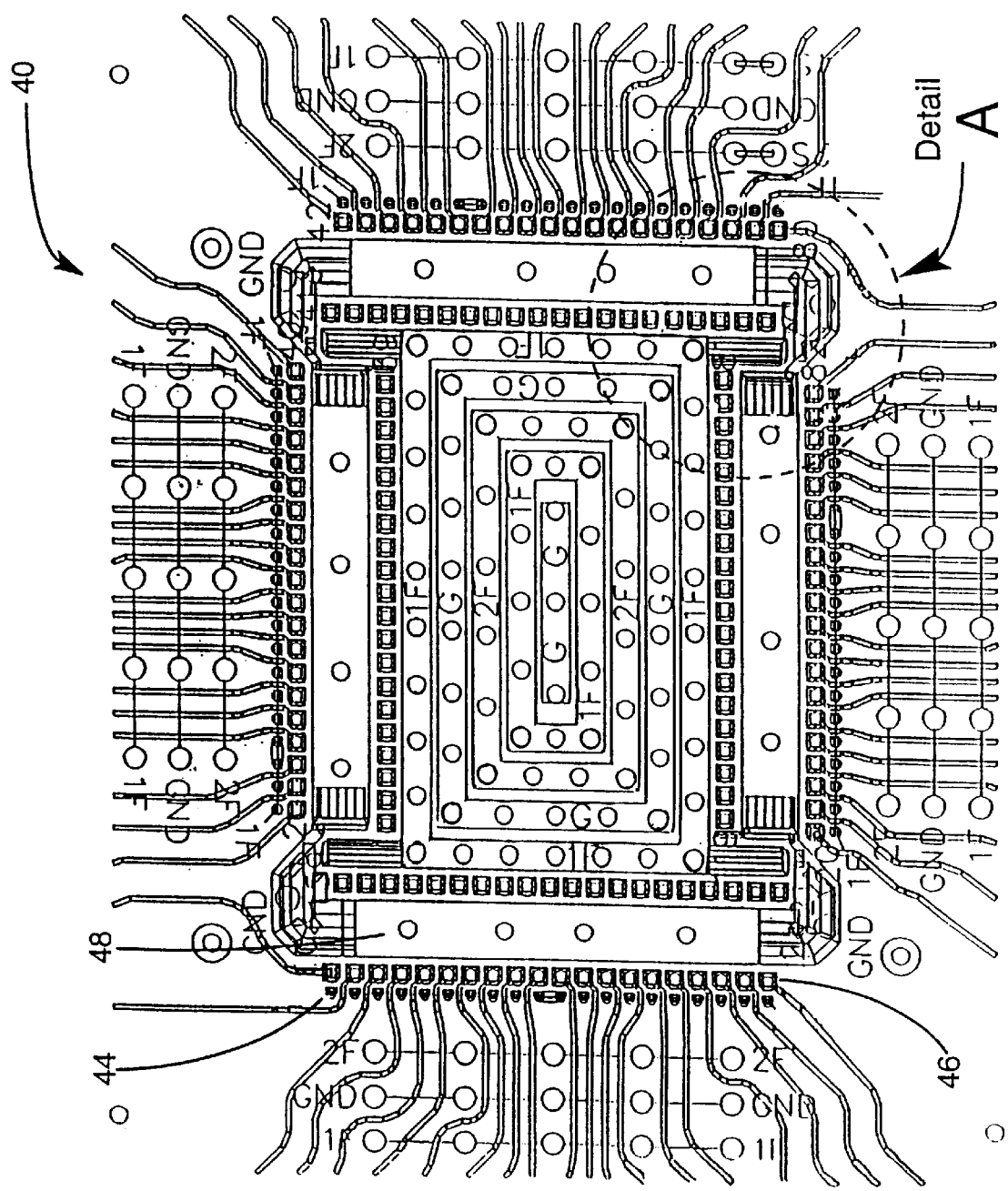
FIG. 2C, labeled prior art, is a further enlarged view of the load board of FIGS. 2A and 2B.

FIG. 2C is a further enlarged plan view of test area 40 of load board 29, showing detail of DUT test site 40 where power supply and ground jumpers, not shown, are conventionally soldered to customize load board 29 to a unique DUT. Power supply voltages are typically connected from a test system 15 to plated through holes and solder pads 44 in the same positions throughout a family of load boards 29, and are customized to different unique DUTs by installing jumpers, not shown, from through-holes 44 to the proper DUT pinholes and solder pads 46.

Ground connection is typically made to plated through holes and solder pads 48 at the same positions throughout a family of load boards 29, and are customized to unique DUTs by soldering jumpers, not shown, from a ground position on plated through-holes and solder pads 48 to the proper DUT pinholes and solder pads 46.

There are problems, as described above, with manually soldering jumpers between DUT socket plated through-holes and solder pads and power supply and ground pinholes and solder pads. For example, jumpers and solder pads in a conventional apparatus are typically very small and closely spaced. There are a number of steps involved with each jumper connection in a conventional process. The conventional process is time consuming, tedious, and has a reasonable potential for bad solder joints that may need to be reworked, which increases the risk of damage to plated through holes and solder pads.

Jumpers by Conductive Polymer Bridge

Figure 3:
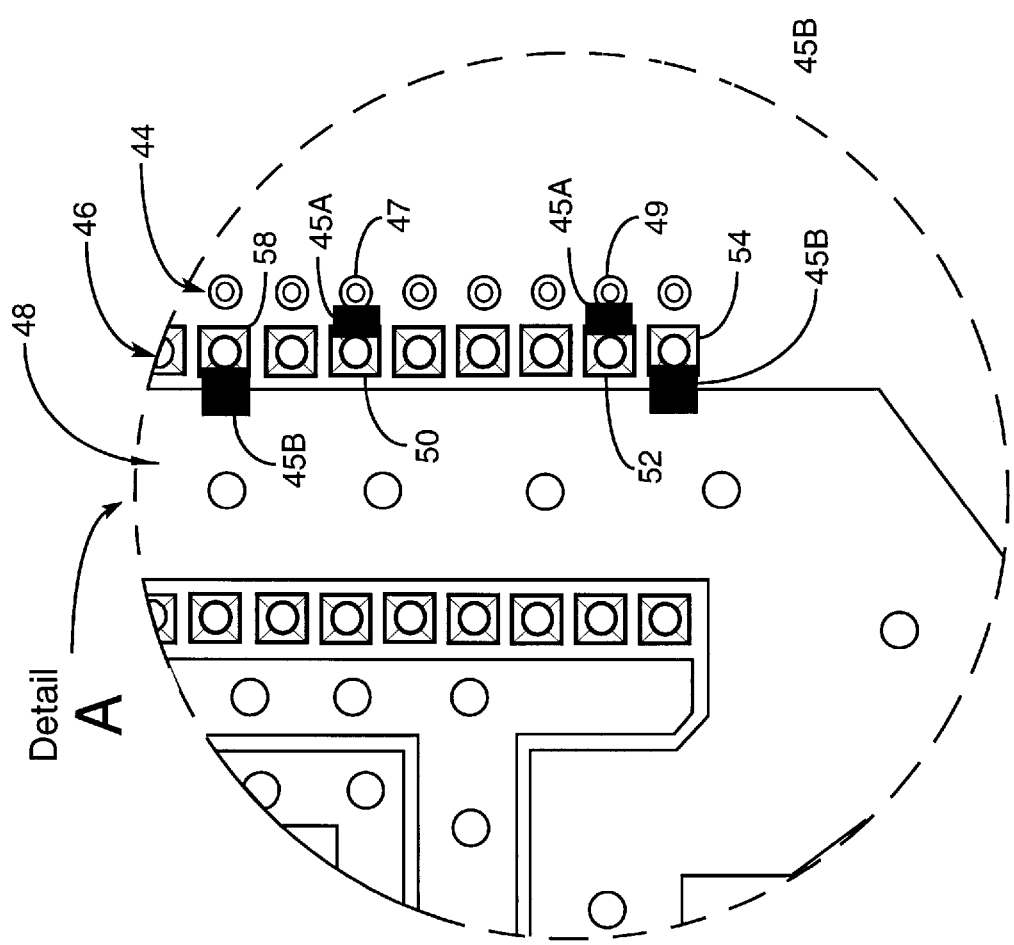
FIG. 3 is an enlarged view of the area in dotted circle labeled "Detail A" in FIG. 2C, showing jumpers of conductive polymer material made by a method according to an embodiment of the present invention.

FIG. 3 is an enlarged illustration of the area in dotted outline labeled Detail A in FIG. 2C, which shows jumpers formed of a conductive polymer material, applied in a process according to a preferred embodiment of the present invention. There are a number of suitable conductive polymer materials, such as Silver-Conductive No. 402 Resin, made by Adhesive Systems of Germantown, Wisc., which, after being applied, have conductive properties similar to conductive metal jumpers as typically made in current art.

In making such jumpers, practicing the present invention involves use of a template, with openings for placing conductive polymer material at exactly the right position to make a jumper, either for power or for ground. A template in practicing the invention is configured for a unique DUT and more fully described below, and is secured firmly to cover DUT test site 40. A conductive polymer is applied over all template openings for conductive paths in a method more fully described below, and the template is shortly removed. Load board 29 is then processed, such as by heating, to cure the conductive polymer.

FIG. 3 shows conductive polymer jumpers 45A from power-connected plated through-holes 47 and 49 to the proper DUT socket plated through-holes with solder pads 50 and 52. Conductive polymer jumpers 45B connect from ground plane 48 to DUT plated through holes and solder pads 54 and 58. The method of applying conductive epoxy for jumpers to load board 29 is accomplished more easily and less expensively than the conventional method of making soldered jumpers.

Figure 4A:
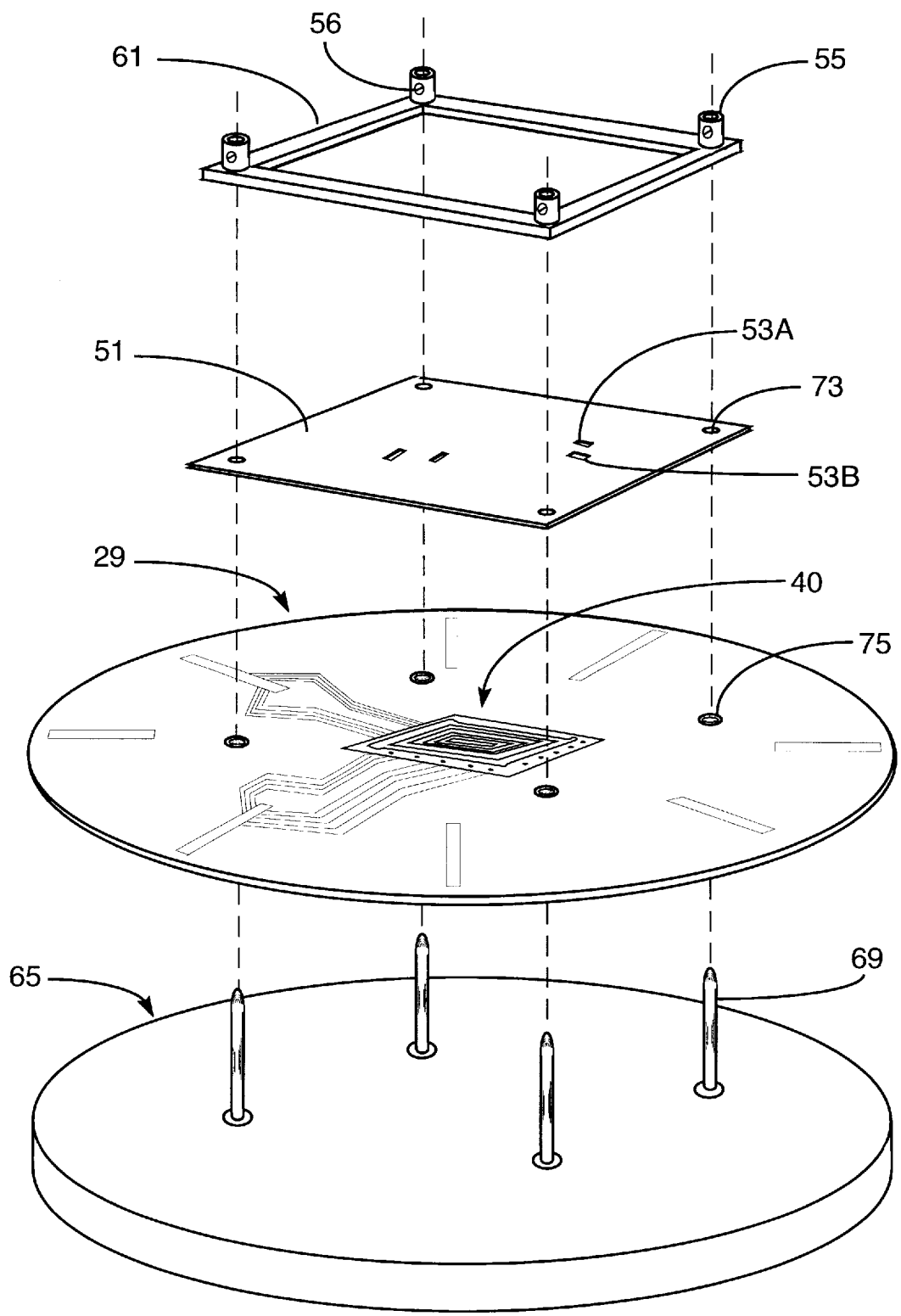
FIG. 4A is an exploded isometric view of a thick-film apparatus according to an embodiment of the present invention for applying conductive polymer jumpers to configure test system power supply and ground connections on a load board.

FIG. 4A is an exploded isometric view of an apparatus according to an embodiment of the present invention for applying conductive polymer jumpers to configure power and ground connections on a load board to match the requirements of a unique DUT socket. A template 51 is provided with openings 53A and 53B positioned precisely to make jumpers on load board 29. In addition to openings for making jumpers, template 51 also has alignment holes 73 for aligning the template to a load board, and openings 53A and 53B are positioned accurately relative to alignment holes 73.

Template 51 may be made of a variety of materials with consideration given to an ability to provide openings such as openings 53A and 53B with substantial accuracy relative to alignment holes, and to dimensional stability. Several plastic materials are suitable, such as polyethylene and others, and metals such as shim stock may also be used in some cases. The alignment holes and precision openings for making jumpers may be made in the template in any of several ways, such as by punching, laser machining, discharge machining, and the like, determined in part by the kind of material used for the template.

A frame 61 fits over and contacts all edges of template 51 to provide a firm contact between template 51 and DUT test site 40 so that openings 53A and 53B define precise volumes to define conductive jumpers. Load board 29, template 51, and frame 61 assemble on pins 69 engaged accurately in a fixture 65 to accurately and firmly position the elements to insure that conductive polymer jumpers are applied precisely.

Holding pins 69 pass through load board mounting holes 75, template alignment holes 73, and bushings 55, and the assembly is secured by set screws 56 in bushings 55.

Figure 4B:
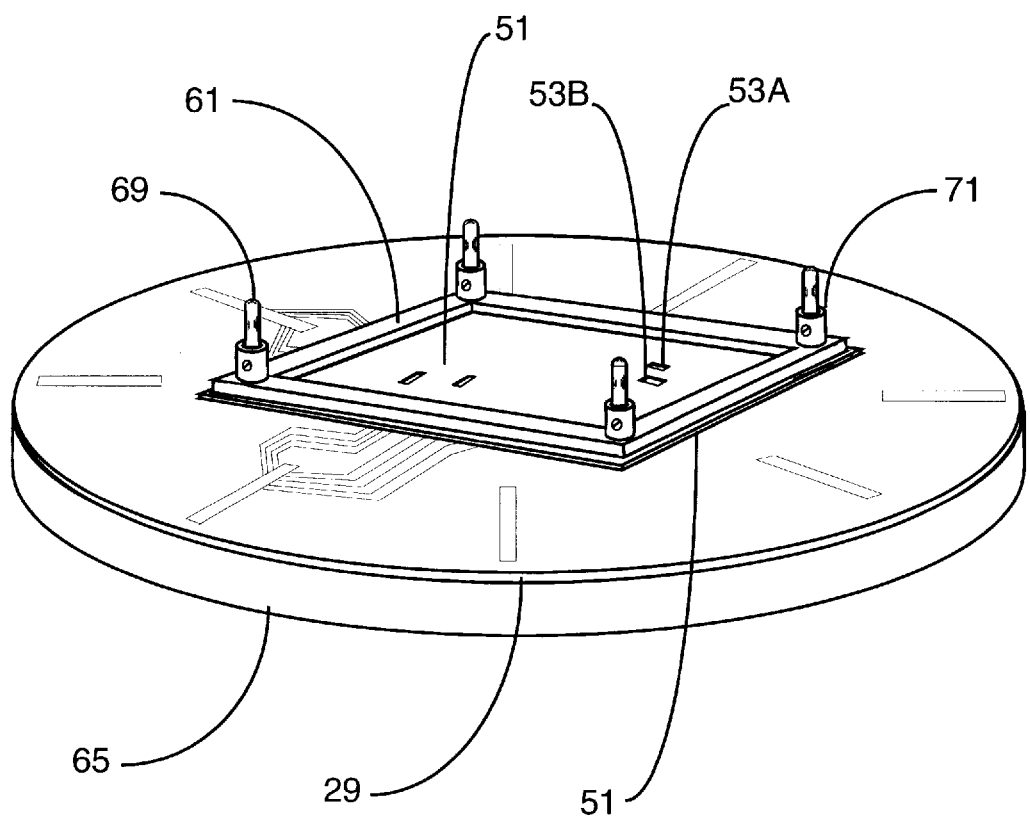
FIG. 4B is an isometric view of the exploded apparatus of FIG. 4A, assembled for practicing a method according to an embodiment of the present invention.

FIG. 4B is an isometric view of the apparatus of FIG. 4A fully assembled for making conductive polymer jumpers. Load board 29 is placed on load board fixture 65. Template 51 is placed on load board 29 covering test site 40. Holding frame 61 is placed over template 51. All the above elements are secured firmly by holding pins 69, bushings 55, and set screw 56. A conductive polymer is applied over, and worked into the template openings 53A and 53B in any convenient manner, such as by a squeegee, to assure complete filling of openings and forming of the polymer jumpers. After applying conductive polymer jumpers, template 51 is removed from load board 29 and the load board is heated to facilitate curing of the polymer material.

In FIG. 3, jumpers are made on one side of the load board, in this case the underside of the board from the side where a receptacle or test socket is mounted. In some embodiments, however, jumpers may be made on either side or both sides of the board. For example, the ground jumpers for the board shown might be made on the underside, where a broad ground plane 48 is shown, and the power jumpers may be made on the topside of the board.

In the case of jumpers made on both sides of the board, the process according to the invention will be repeated on the opposite side of the board with a different template. Further, the board shown is but one example of many possible board designs. The locations of power through-holes 44 adjacent each of the pinholes 46 is convenient in the example described, but is not necessarily the case in all instances. A power plane on the topside of a board may, for example, be implemented similar to the ground plane shown on the bottom side of the board, and jumpers could be made from pinholes to the power plane on the topside.

In still another aspect, points to be connected on a board may be relatively remote, compared to the example described above. In some cases, then, openings in a template for practicing the present invention may be fashioned to provide conductive traces of some considerable length relative to the short jumpers shown. In the case of relatively remote points to be connected, the traces provided by filling opening in a template with conductive material while the template is maintained in an appropriate position, may be relatively complex, having one or more turns, rather than being simple straight lines. Such geometry in some embodiments may well be needed to avoid other features on a board to be processed.

Figure 4C:
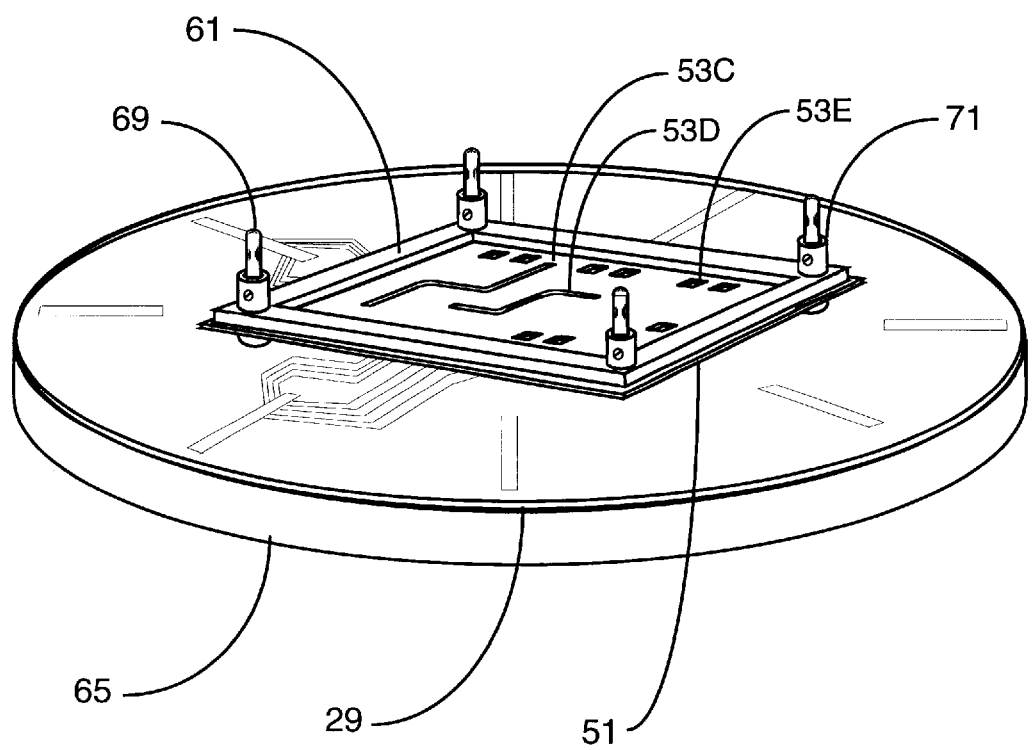
FIG. 4C is an isometric view of an assembled thick-film apparatus according to another embodiment of the present invention.

FIG. 4C is an isometric view of an embodiment of the apparatus shown in FIGS. 4A and 4B having openings in a template to provide traces on a printed circuit board. This apparatus is the same as the apparatus previously described, except openings 53C and 53D are elongated and shaped to provide conductive traces on board 29 rather than simply short jumpers as shown in FIGS. 4A and 4B. In FIG. 4C, opening 53E represents jumper openings similar to openings 53A and 53B in FIGS. 4A and 4B. Such openings as these can be extended and designed to provide traces and jumpers of virtually any description on a load board, or indeed on any sort of printed circuit board.

Welded or Compression-Bonded Jumper Strips

In an alternative embodiment a highly conductive ribbon, such as gold ribbon, is welded between DUT pin pads and ground or power pin pads on a load board. In this overall process, a circuit board repair station may be used, as described below, and a computer-generated template, similar to the template describe above for positioning polymer jumpers, is used to mark positions for welding jumper strips.

Figure 9A:
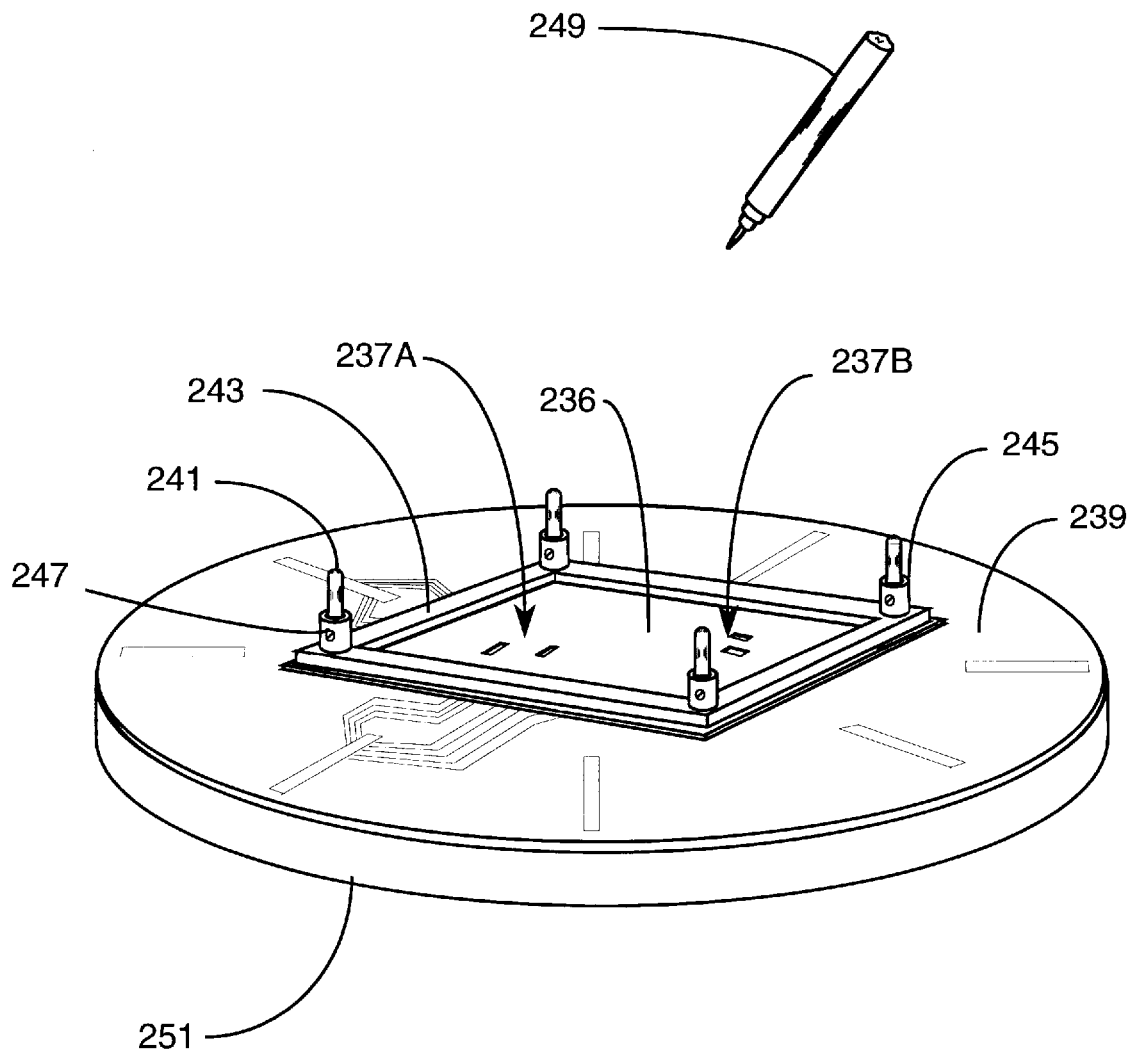
FIG. 9A is an isometric view of an apparatus for marking jumper strip locations according to a further embodiment of the present invention.

FIG. 9A is an isometric view of an apparatus according to an embodiment of the present invention for marking positions where jumper strips are to be welded to configure power and ground connections on a load board. A jumper strip marking template 236 is provided with marking openings 237A and 237B, which are positioned to accurately mark locations on load board 239 where jumper strips are to be welded.

As in the embodiment already discussed above in FIG. 4A, marking template 236 is made from a graphics-based computer application that contains a complete geometric configuration of a basic load board. Customers supply information as to which pin pads are to be jumpered to ground and power. A computer operator enters the data, and automated equipment prepares the template for marking positions where jumper strips are to be welded. As described above relative to FIG. 4A, template cutting can be done in any of several ways. Also, template material may be any of a variety of materials with consideration given to an ability to provide marking openings 237A and 237B, with substantial accuracy relative to alignment holes and dimensional stability.

An apparatus for aligning marking template 236 to load board 239 in this embodiment is virtually the same as in the embodiment shown in FIGS. 4A and 4B. For example, marking template 236 has alignment holes, not shown, into which marking alignment pins 241 are inserted to align the template to load board 239 so marking openings 237A and 237B are positioned accurately. A frame 243 in this embodiment fits over and contacts all edges of marking template 236 to provide a firm contact between marking template 236 and DUT test site 40 (FIG. 1) so that marking openings 237A and 237B define precise locations to mark were jumper strips are to be welded. The entire assembly is secured firmly in place to fixture 251 for accurate marking by bushings 245 with set screws 247. Fixture 251 is heavy enough to hold load board 239 steady during marking and welding operations, which are described below.

With marking template 236 securely in place on load board 239, a fine-tipped marker 249, which contains a highly visible marking ink, in a bright color, such as white, yellow, or orange, is applied the DUT test site at jumper strip marking openings 237A and 237B. These marks show where jumper strips are to be welded. Visible marks may also be applied with a hand brush, air-brush, pen or by any other suitable method. After marking is completed, marking template 236 is removed from load board 239, which is now clearly marked ready for compression welding.

Figure 9B:
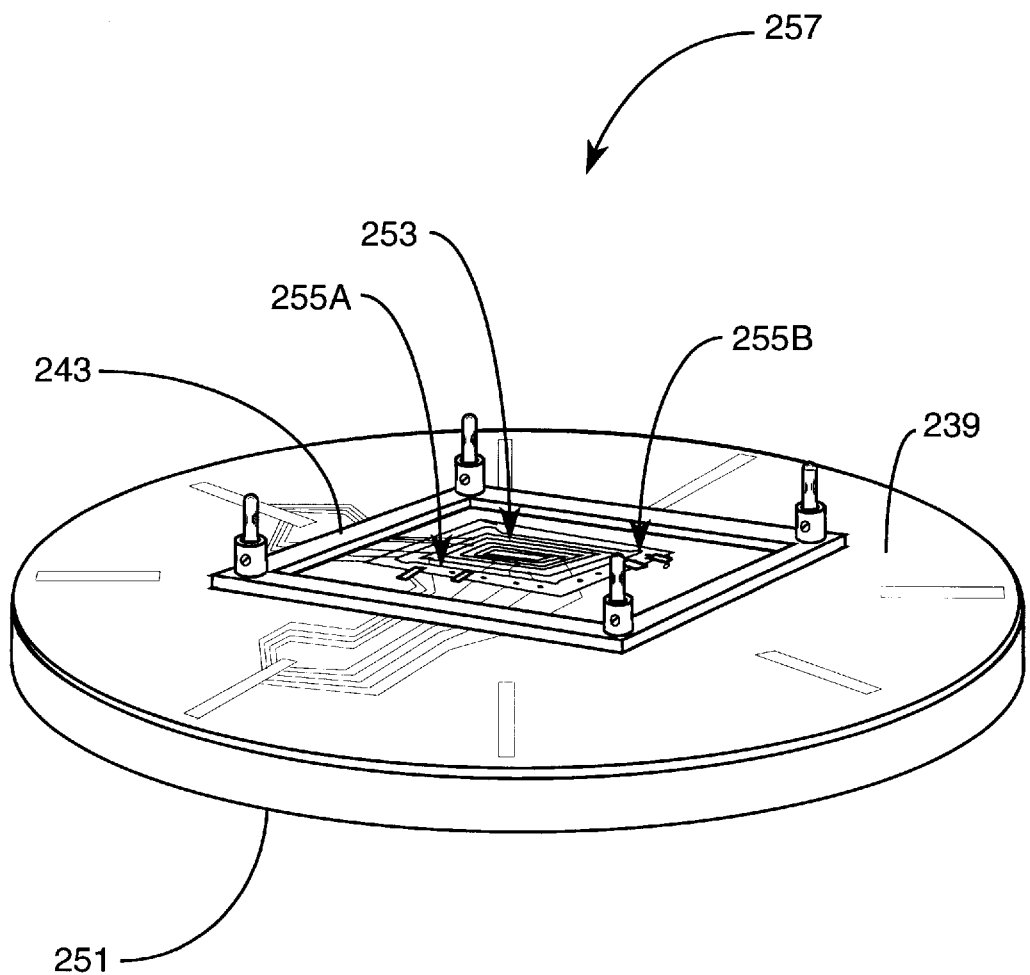
FIG. 9B is an isometric view of a load board prepared for welding of jumpers according to the embodiment for which marking is done per FIG. 9A.

FIG. 9B is an isometric view of a load board and fixture assembly 257 assembled and ready for compression welding of jumper strips according to this embodiment of the invention.

Load board 239 is secured to fixture 251 with frame 243, alignment pins 241, bushings 245 and set screws 247, in a manner already described relative to FIG. 9A. Marking template 236 has been removed so that DUT test site 253 is exposed to allow welding equipment access to jumper strip markings 255A and 255B. Fixture 251 and the fastening arrangement is for convenience, and is not strictly required in practicing this embodiment of the invention. The load board could be welded as described below without the extra fixture, but the fixturing provides extra stability and dimensional integrity.

Figure 9C:
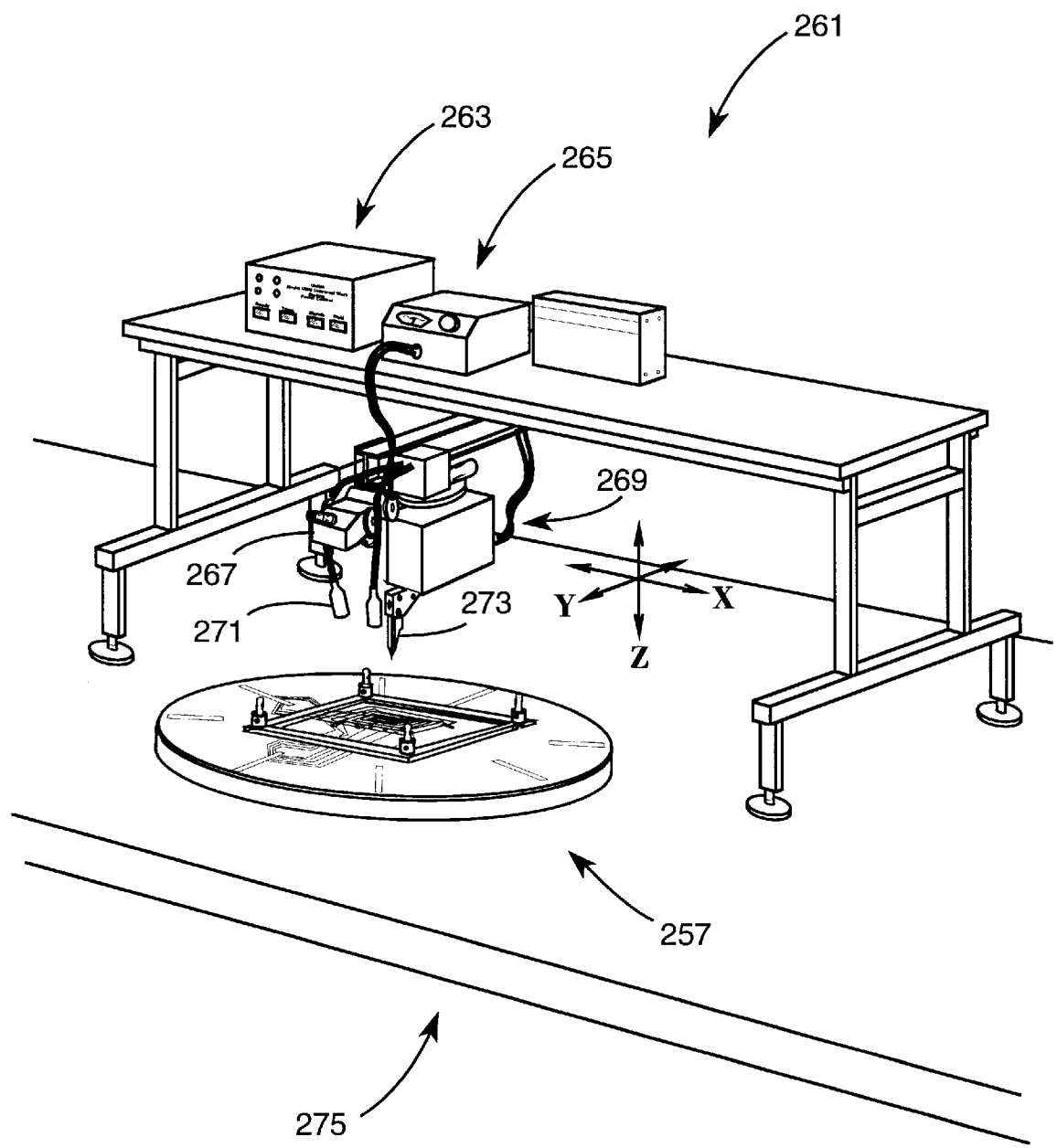
FIG. 9C is an isometric view of a jumper strip welding station used in practicing embodiments of the invention related to FIGS. 9A and 9B.

FIG. 9C is an isometric view of a jumper strip welding station according to this embodiment of the invention, which includes a printed circuit board welder 261, a work bench 275, and load board fixture assembly 257.

Printed circuit board welder 261 is a commercially available printed circuit board welder, such as a Unitek Equipment™, Model UWS Universal Work Station. Welder 261 typically includes a power supply 263, a control panel 265, and a welding arm 269. Welding arm 269 is suspended from a shelf with appendages, not shown, to allow for movement in each of X, Y, and Z axes shown. Welding arm 269 includes a weld head 273, illumination such as a fiber-optic illuminator 271, and a microscope 267. Microscope 267 and illuminator 271 provide a closeup and well-lighted view of the jumper strip welding site. Weld head 273 is rotatable in a horizontal axis, includes welding electrode tips, not shown, and provides sufficient power to weld a jumper strip to a load board pin pad.

Work bench 275 provides a stable platform for welder 261 and load board fixture assembly 257 to enable an operator to do precise welding operations.

Fixture assembly 257 includes a load board with jumper strip markings 255A and 255B (FIG. 9A). Fixture assembly 257 also includes fixture 251 which is heavy enough to facilitate welding site stability during welding operations.

The welding process in this embodiment requires an operator, using microscope 267 and illuminator 271, to physically adjust load board fixture assembly 257 so that a weld site is aligned directly beneath an electrode tip, not shown, on weld head 273.

Figure 9D:
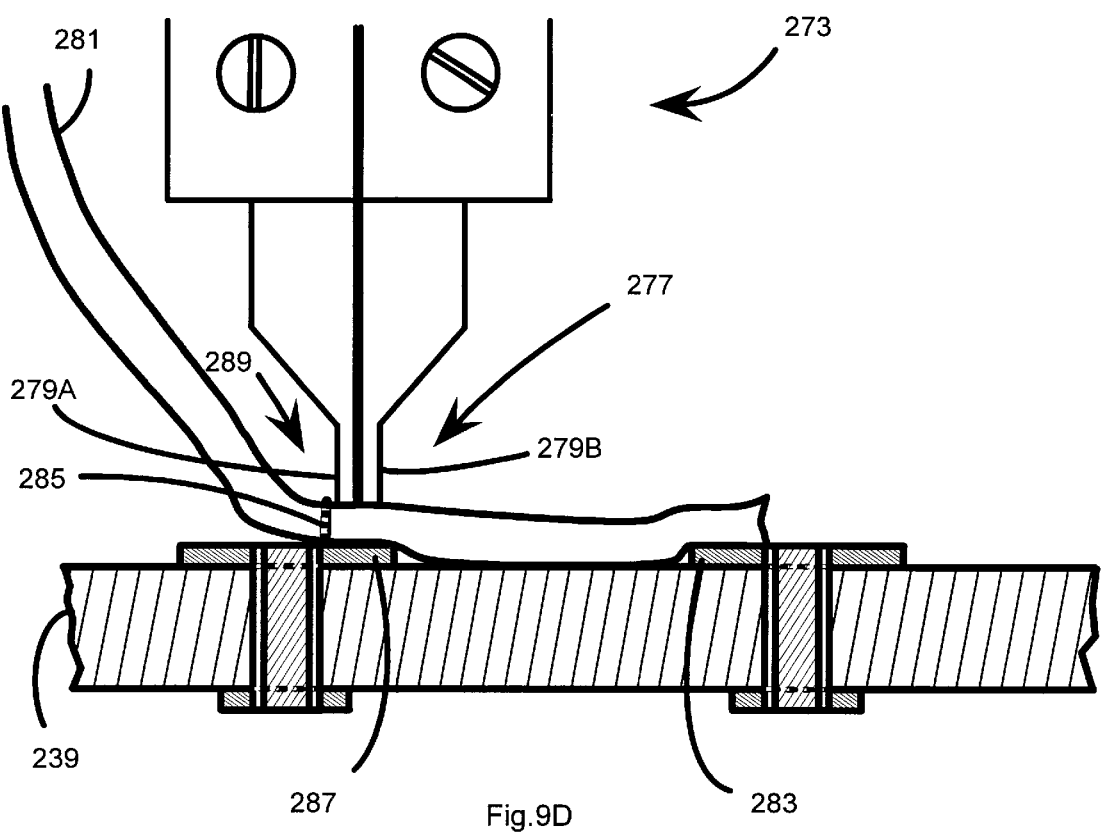
FIG. 9D is a cross-sectional view of a jumper strip weld site on a load board according to embodiments of the invention described with aid of FIGS. 9A–9C.

FIG. 9D is a partial cross-section elevation view of a marked jumper strip weld site on load board 239, showing details of components at weld site 277. Weld site 277 includes pin pads 283 and 287 in load board 239. A jumper strip ribbon 281 is also shown. Ribbon 281 in this embodiment is a gold foil ribbon. Such ribbon is available in many different sizes, and the width and thickness of the ribbon is selected according to the size of available lands on pin positions and power and ground positions on a load board.

After aligning the weld tip having portions 279A and 279B directly above weld site 277, the operator positions a piece of jumper strip ribbon 281 on contact pad 287, directly below electrode tips 279A and 279B. When pin pad 287, jumper strip ribbon 281, and electrode tips 279A and 279B are simultaneously aligned at weld site 277, the operator depresses a foot switch, not shown, which starts an automatic welding cycle controlled by circuitry within printed circuit board welder 261.

During the automatic welding cycle, weld head 273 moves downward until electrode tips 279A and 279B come in contact with jumper strip ribbon 281, urging the strip against pin pad 287. Sensors, not shown, within weld head 273 detect the amount of pressure applied on electrode tips 279A and 279B. When this pressure reaches a operator-defined value, control circuitry in welder 261 initiates a circuit that causes a pre-defined current to flow between electrode tips 279A and 279B for a fixed time duration. The current passes between the tips and through the foil and a portion of the surface of the pin pad. Heat generated by the current due to resistance of the materials is sufficient to cause jumper strip ribbon 281 to thermally bond to pin pad 287. After this welding operation is complete, weld head 273 automatically rises and the automatic weld cycle is complete.

The operator then aligns electrode tips 279A and 279B above another weld side and repeats the automatic welding operation just described. When the welding of both ends of a jumper strip are completed, the operator cuts jumper strip ribbon 281, using any suitable tool, such as an X-acto knife, at cutting site 285. Installing a jumper strip between pin pads according to this embodiment of the invention is thus completed.

Electrode tips 279A and 279B have a very small contact area relative to power, ground and DUT pin pads. The footprint of electrode tips 279A and 279B together, across the tips, is commonly about 40 thousandths of an inch. The gap between the electrodes in such a tip is about ten one-thousandths of an inch. Because of this, it typically takes two or more welding operations to weld a jumper strip to one pad.

Figure 9E:
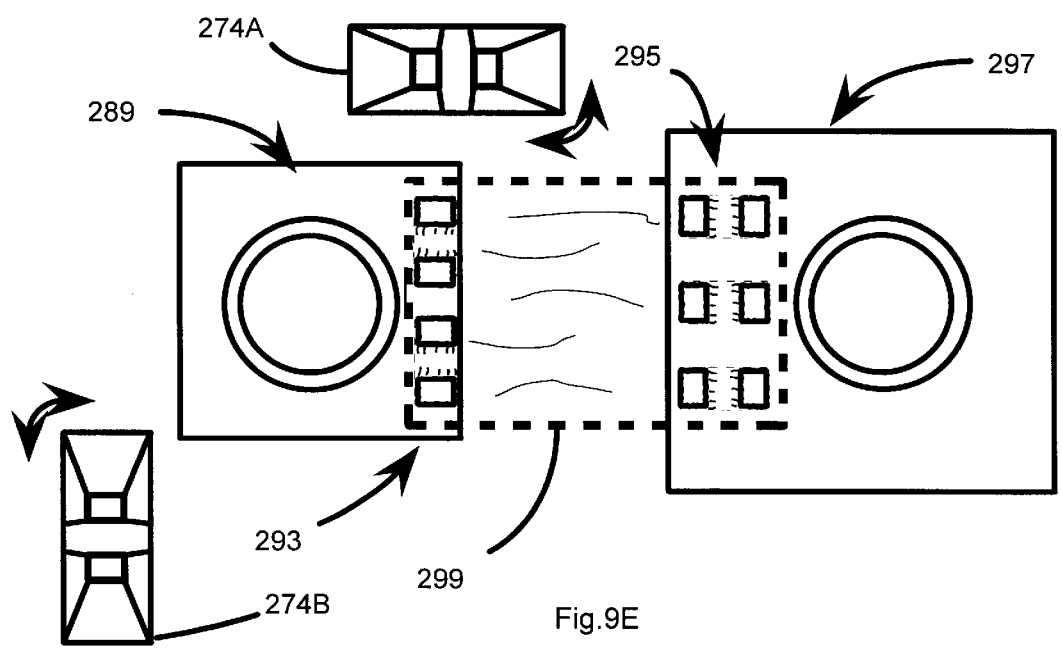
FIG. 9E is a top view of the weld site of FIG. 9D.

FIG. 9E is a plan view of a weld site showing different weld footprints where a DUT pin pad is jumpered to a load board power pad. Weld tip portions 274A and 274B are shown as viewed from the load board. Load board pin pads 289 and 297 are shown as viewed from a weld head.

Typically, ground and power pin pads have a relatively large land area compared to DUT pin pads. For example, DUT pin pad 289 in FIG. 9E is smaller than load board power pin pad 297. The weld head in the present invention is rotatable and lockable on a horizontal axis (X-Y axis in FIG. 9C) to accommodate these differences. For example, weld footprint 295 on power pin pad 297 is a result of rotating weld head 274A so its longest axis is parallel with the length of jumper strip 299. Weld footprint 293 is a result of rotating weld head 274B so its longest axis is at a 90 degree angle with the length of jumper strip 299. This ability to rotate the weld head allows for welding to pin pads that do not extend in the jumper direction a distance great enough to allow for welding as shown for footprint 295.

Complete customizing of a DUT site on a load board to suit a customer's power and ground requirements typically requires more than one jumper strip. In these cases the above process is repeated until all required jumper strips are welded.

The jumper strip welding process described in the embodiment described with the aid of FIGS. 9B, 9C, 9D, and 9E is manually controlled by an operator. Other embodiments may be partially or completely computer-controlled without departing from the spirit and intent of the present invention. For example, an operator using a computer-controlled welding process need only to load a file with customer jumper placement instructions using conventional means, such as a memory disk or tape. He would then place load board fixture assembly 257 (FIG. 9C) in a holding jig and activate the program operation with a switch, keyboard strokes or some other suitable means. Routines in the program would operate servo mechanisms to accurately position electrode tips 279A and 279B) directly above weld sites, automatically play out and position the proper length of jumper strip ribbon 281 (FIG. 9D), weld all weld sites needed to securely connect a jumper strip, cut the jumper strip ribbon, and move welding arm 269 (FIG. 9C) to another next weld site. The automated jumper strip welding process just described automatically repeats until all DUT test site power and ground jumper strips needed to configure a load board are installed.

Copper-Clad Laminate Deposition Jumper Strips

In yet another embodiment of the present invention, copper jumper strips are provided on a laminate base according to a customer's DUT power and ground requirements. The copper-clad laminate is then aligned and pressed to a DUT test site on load board with the jumper strips against the load board. The jumper strips remain permanently bonded to the load board when the laminate base is removed.

Figure 10A:
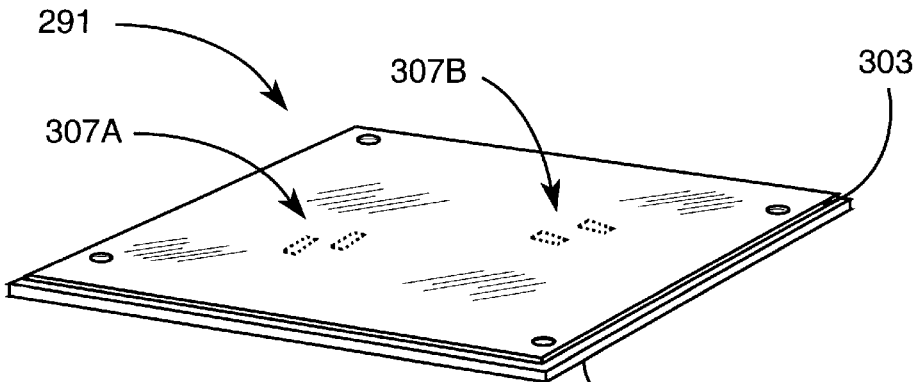
FIG. 10A is an isometric view of a copper-clad laminate used in practicing a further embodiment of the present invention.

FIG. 10A is an isometric view of a copper-clad laminate 291 as used in this embodiment of the invention. Copper-clad laminate 291 comprises a base material 305 coated with a copper laminate layer 303, or any other suitable conductive material, such as gold. Laminate 303 is attached to base material 305 with a non-permanent adhesive. Jumper strip locations 307A and 307B are etched or cut, by one of many ways known in the art, such as lithography and subsequent photo-chemical etching, into copper laminate 303, then the excess conductive material is removed.

Figure 10B:
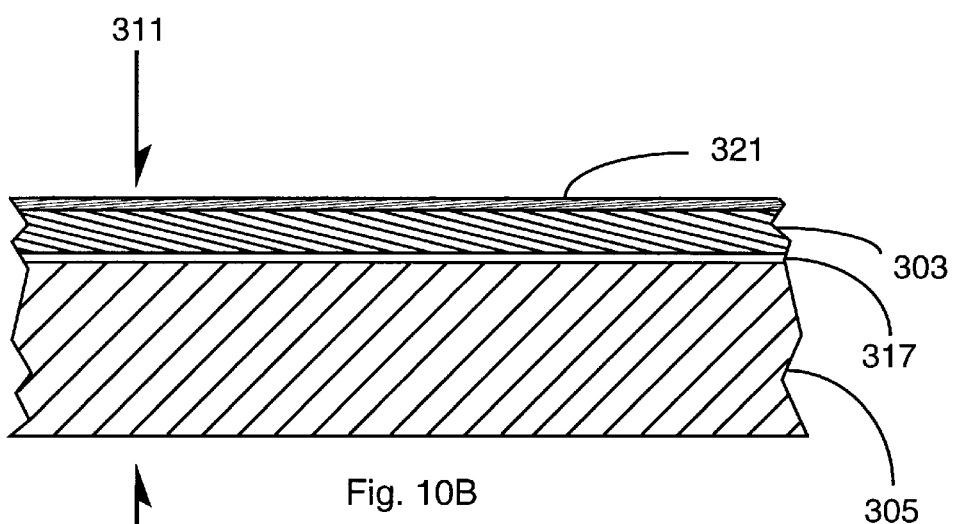
FIG. 10B is a cross-sectional view of the copper-clad laminate of FIG. 10A.

FIG. 10B is a cross-sectional view of laminate 291 showing a permanent conductive adhesive layer 321, conductive material layer 303, non-permanent adhesive 317, and base material 305. Permanent conductive adhesive 321 provides a means to permanently attach jumper strips, which are etched out of copper laminate 303, to a load board.

Figure 10C:
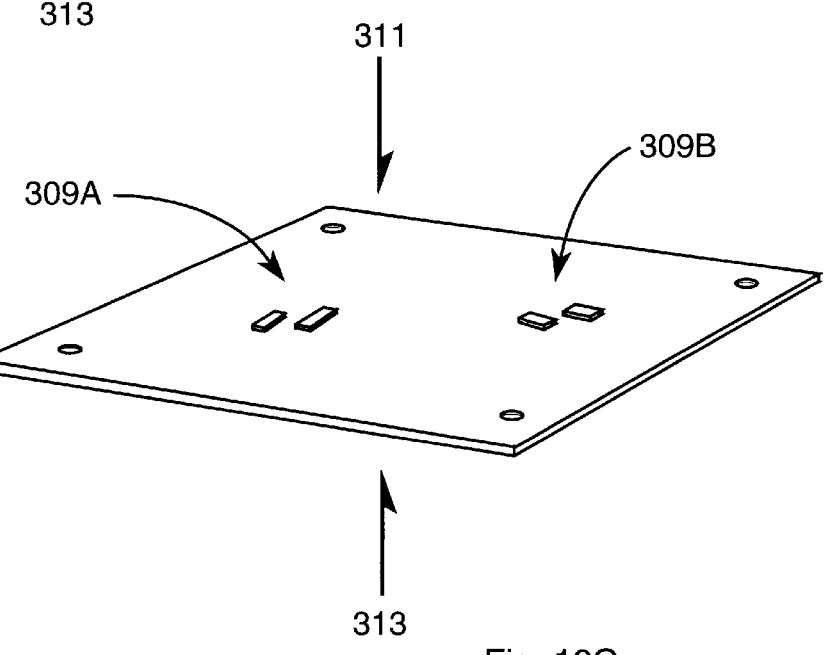
FIG. 10C is an isometric view of a laminate base with deposition jumper strips after processing the laminate of FIGS. 10A and 10B.

FIG. 10C is an isometric view of a laminate base with jumper strips according to this embodiment showing jumpers 309A and 309B after removal of excess conductive material.

Figure 10D:
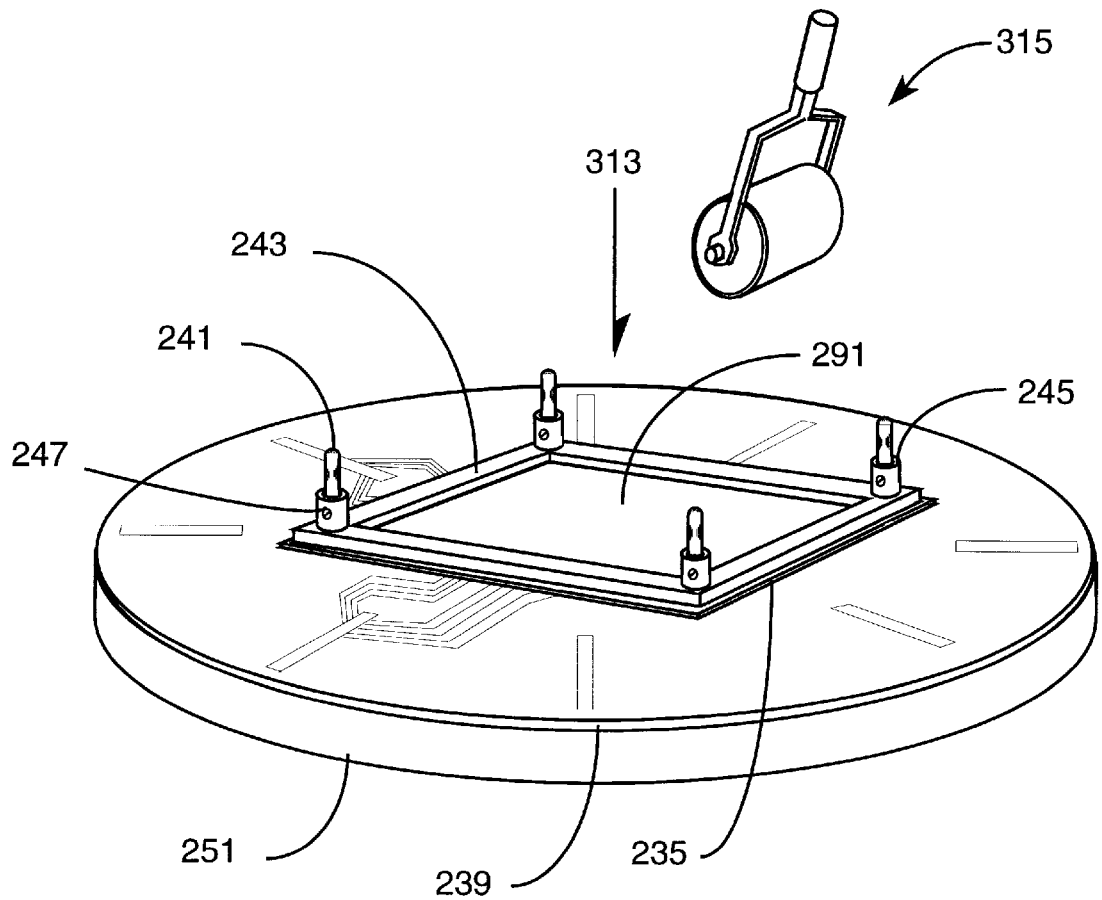
FIG. 10D is an isometric view of an apparatus and method of depositing jumper strip laminates according to another embodiment of the present invention.

FIG. 10D is an isometric view of an apparatus and method for depositing jumper strips 309A and 309B on a DUT test site on a load board according to this embodiment. The laminate is placed over a DUT site bottom up, so jumper strips 309A and 309B contact the load board, and positioned so the jumpers on the laminate backing are positioned between the pin pads to be jumpered. In this embodiment, adhesive 321 on the jumper strips contacts the load board.

Apparatus for aligning laminate 291 to load board 239 so that jumper strips 309A and 309B are properly located is similar to the apparatus shown in FIG. 9A. For example, laminate 291 has alignment holes, not shown, into which alignment pins 241 are inserted to align the template to load board 239 so copper jumper strips 309A and 309B (FIG. 10C) are positioned accurately.

As in the embodiment described above with the aid of FIG. 9A, a frame 243 fits over and contacts all edges of copper-clad laminate 291 to provide a firm contact between the conductive adhesive 321 (FIG. 10B) on jumper strips 309A and 309B and the DUT test site. Jumper strips are then firmly and permanently bonded to the DUT test site with the aid of even pressure applied using a roller 315, or a similar device. Fixture 251 is heavy enough to hold load board 239 steady during application of the laminate to the DUT test site.

Figure 10E:
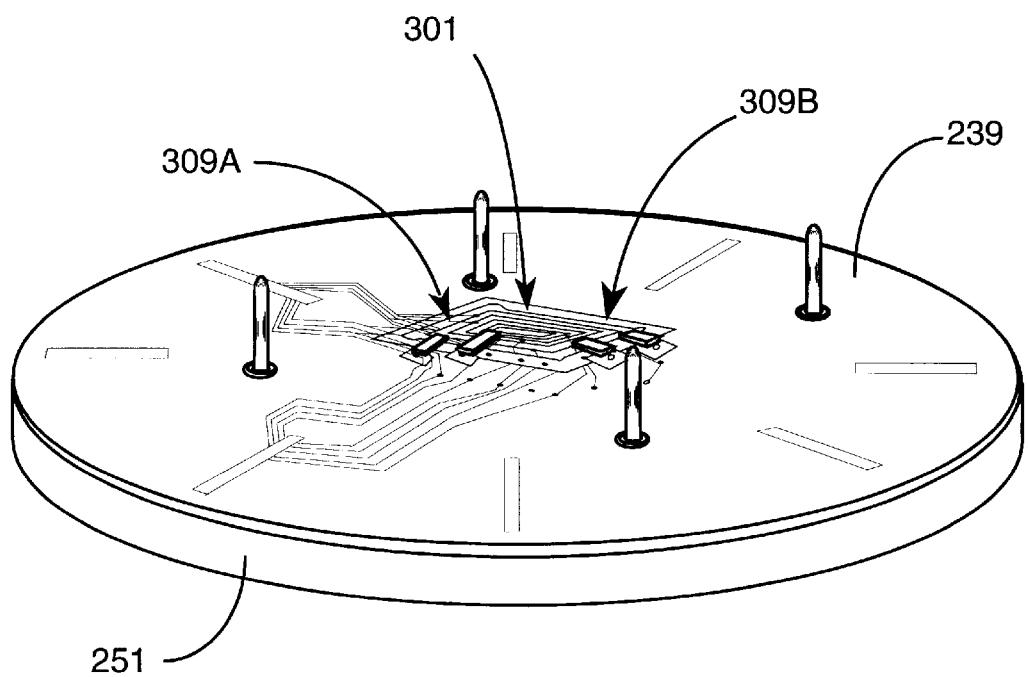
FIG. 10E is an isometric view of a load board with deposition jumper strips applied by the method related to FIGS. 10A–10D.

FIG. 10E shows jumper strips 309A and 309B attached to DUT test site 301 on load board 239. After jumper strips 309A and 309B are bonded to the DUT test as described above, frame 243 is removed and laminate 291 is carefully peeled away, leaving the jumper strips attached to the load board. Conductive adhesive 321 (FIG. 10B) allows bonding of the jumper strips to DUT test site 301 while allowing conductivity between jumper strips and pin pads (not shown). It has been found also that many adhesives are suitable that are not particularly conductive, as the close proximity of the jumper and the pads is sufficient to provide electrical contact.

Adhesive 317 provides temporary bonding and allows easy separation of the laminate from the jumper strips after the jumper strips are bonded to the DUT test site.

Deposition of Jumper Strips through a Mask

In yet another alternative embodiment of the present invention, a coating, such as a peelable solder mask, is used to cover all areas on a load board except where jumper strips are to be added. The purpose of covering such areas is to prevent depositing metal on the load board except where the jumpers are to be made. The coating, in some embodiments therefore, has to provide protection for the load board in liquid plating bath solutions, which, in some cases, may be corrosive. There are a number of such materials known to those with skill in the art, and which may be applied by silkscreening, as well as by other methods.

In an exemplary overall process a computer-generated template is used to position and jumper strip stencils on a silk screen. The silk screen with stencils in place is then used to apply the protective coating. Opening are left in the protective coating where jumper strips are to be provided. The jumper strips may then be added in the proper positions by a conventional deposition technique, such as electroplating, electroless plating, physical vapor deposition (PVD), solder application, or by a combination of such techniques.

In this embodiment of the invention, a laminate is prepared in much the same manner as described above for a conductive laminate. In this case, however, the material on the backing need not be conductive. After removing excess material, providing a laminate-based set of jumper stencils much like that of FIG. 10C, the jumper stencils are transferred to a silk screen in a transfer step similar to the process depicted in FIG. 10D. The silk screen is then joined and positioned on a load board with the jumper stencils positioned at the sites where jumpers a desirable. The protective coating material is then applied in a silk screening process, the stencils preventing the protective coating material from being applied to the jumper positions. When the silk screen is removed and the coating material is cured, the load board is covered with the protective coating material except at the jumper sites.

Figure 11A:
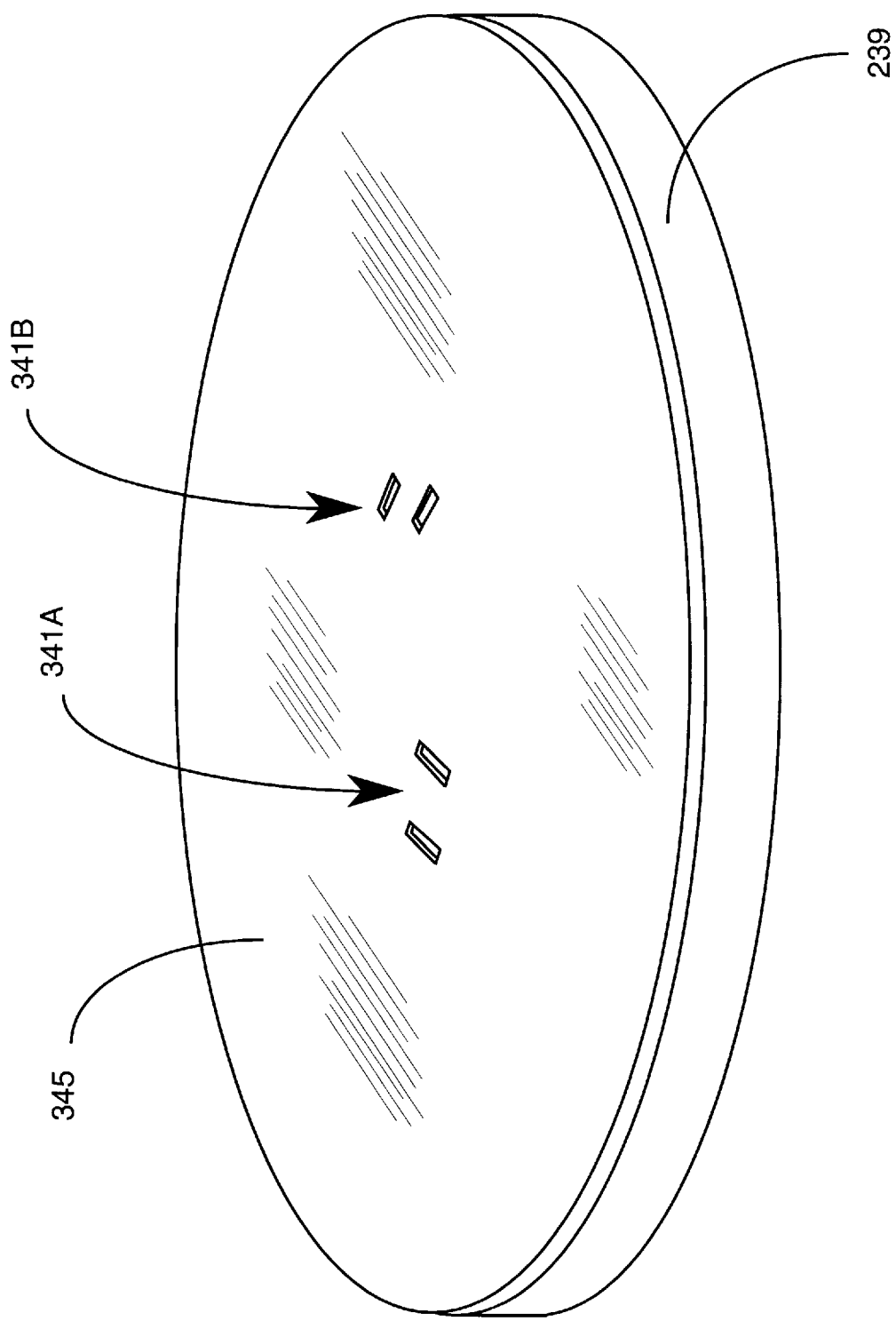
FIG. 11A is an isometric view of a load board covered with a peelable solder mask material according to yet another embodiment of the present invention.

FIG. 11A is an isometric view of a load board 239 covered with protective material 345, leaving openings to the load board at sites 341A and 341B, where jumpers are to be applied. In one alternative method for providing jumpers given the masked load board as in FIG. 11A, a very thin layer of conductive plating base is applied, inside jumper strip locations 341A and 341B. The load board is then taken through a plating process by which plated jumpers are applied.

The necessity for a process by which the surface at the jumper sites may be rendered electrically conductive, is that the region between pin pads on the load board, where a jumper is to be applied, is a nonconductive surface. It is needed to make this surface nominally conductive, so the surface may act in a plating bath as a conductive surface, allowing conventional plating techniques to provide jumpers of a conductive material, such as gold or copper. There are a number of commercially available processes by which non-conductive surfaces may be made conductive for purposes of plating steps to follow, and these are generally known in the art.

In alternative embodiments a thin layer of material may be applied by a PVD process, like sputtering, as a preliminary step in plating. There are also electroless plating procedures known in the art by which the jumper positions may be prepared for plating. In yet other embodiments PVD processes, such as sputtering or metal vapor deposition may be used to provide all of the metal thickness of the jumper strips.

Figure 11B:
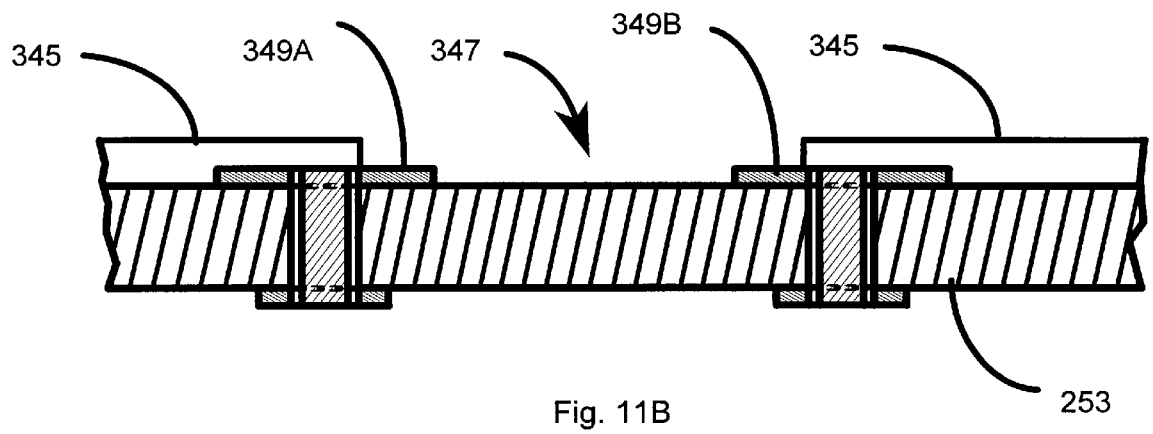
FIG. 11B is a cross-sectional view of one of the load board jumper strip locations of FIG. 11A.

FIG. 11B is a cross-sectional view of a jumper site from FIG. 11A. In an embodiment wherein plate-up is used, a thin layer of conductive material is applied in jumper strip opening 347, providing a continuous connection between pin pads 349A and 349B as is described above. This conductive base provides a base to which plating, such as gold plating, will bond, and which allows the surface to act as an electrode in a plating bath. In an alternative embodiment, the surface is rendered conductive, a thin layer of metal is plated on the surface, and then solder is applied by conventional techniques. In this embodiment it is necessary that the layer of metal before soldering is applied be sufficient to cause molten solder to flow and cover the surface.

Figure 11C:
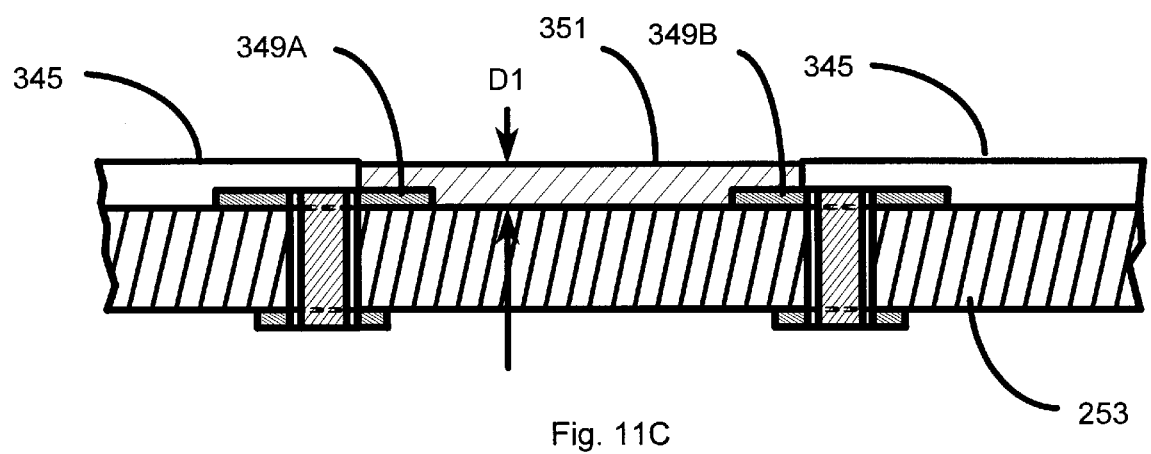
FIG. 11C is the cross-sectional view of FIG. 11B after plating.

FIG. 11C is a cross-sectional view of a load board DUT test site after electroplating, solder application, electroless plating, PVD, or a combination of techniques is used, is complete. In the exemplary case, gold plating has been used, and gold-plated jumper strip 351 fills jumper strip opening 347 (FIG. 11B) to a desired thickness D1 and provides a permanent electrically conductive path between pin pads 349A and 349B.

Figure 11D:
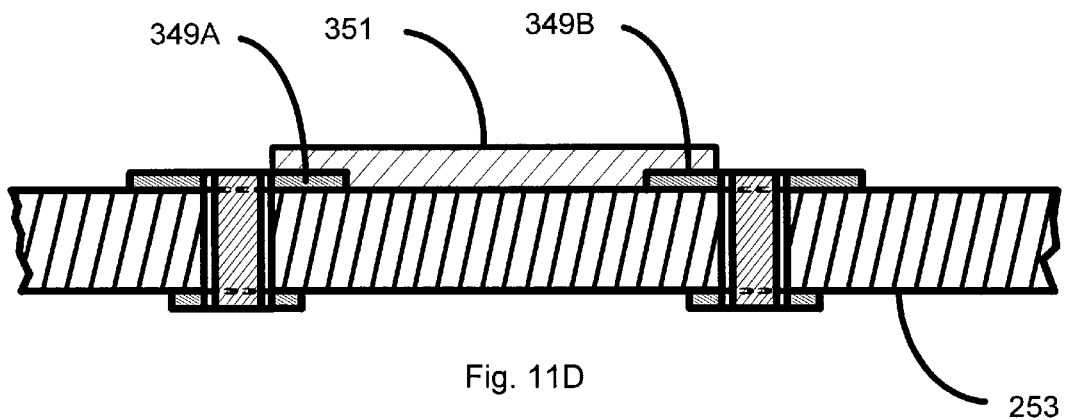
FIG. 11D is the cross-sectional view of FIG. 11C after solder mask removal.

FIG. 11D is a cross-sectional view of a load board DUT test site described above in FIG. 11C after protective coating 345 has been peeled away. Jumper strip 351 remains connected to pin pads 349A and 349B and the load board DUT test site is configured to suit customer requirements.

It will be apparent to those with skill in the art that there are a variety of alterations that might be made in details of embodiments of the apparatus described above without departing from the spirit and scope of the invention. For example, there are many alternatives for many of the materials described, and different choices might be made in specific instances. There are similarly many alterations in the apparatus that might be made within the spirit and scope of the invention. For example, there are equivalent ways the board and the template might be registered and secured to accomplish practicing the invention.

As an example of other securing methods, the template could be secured to the load board by such as tape over the edges of the template onto the load board, or a template with sticky-back material like "Post-it" memos might be used, which would make the template stick to the load board while applying a conductive polymer, and could then easily be peeled off after application. One might also use any of a number of latching devices with a holding frame, such as cam locks, wing nuts, or cotter keys.

A Smart Receptacle

The embodiments described above provide a quick and relatively inexpensive method for customizing a load board for IC test apparatus so power and ground connect to the appropriate leads of a DUT placed in a socket mounted on and connected to the load board. A customized load board according to the above descriptions and equivalents can be used with conventional receptacles and sockets in a test system.

In another aspect of the present invention, the inventor has provided a unique receptacle, termed by the inventor a Smart Receptacle, that allows decoupling capacitors to be coupled much closer to power leads of a DUT than has previously been possible. In some aspects of the invention this Smart Receptacle can be used with a load board customized according to a process of an embodiment of the present invention, and in other aspects the load board can be conventional, and full customizing is accomplished by the receptacle instead of by forming finishing jumpers on the load board.

Figure 5:
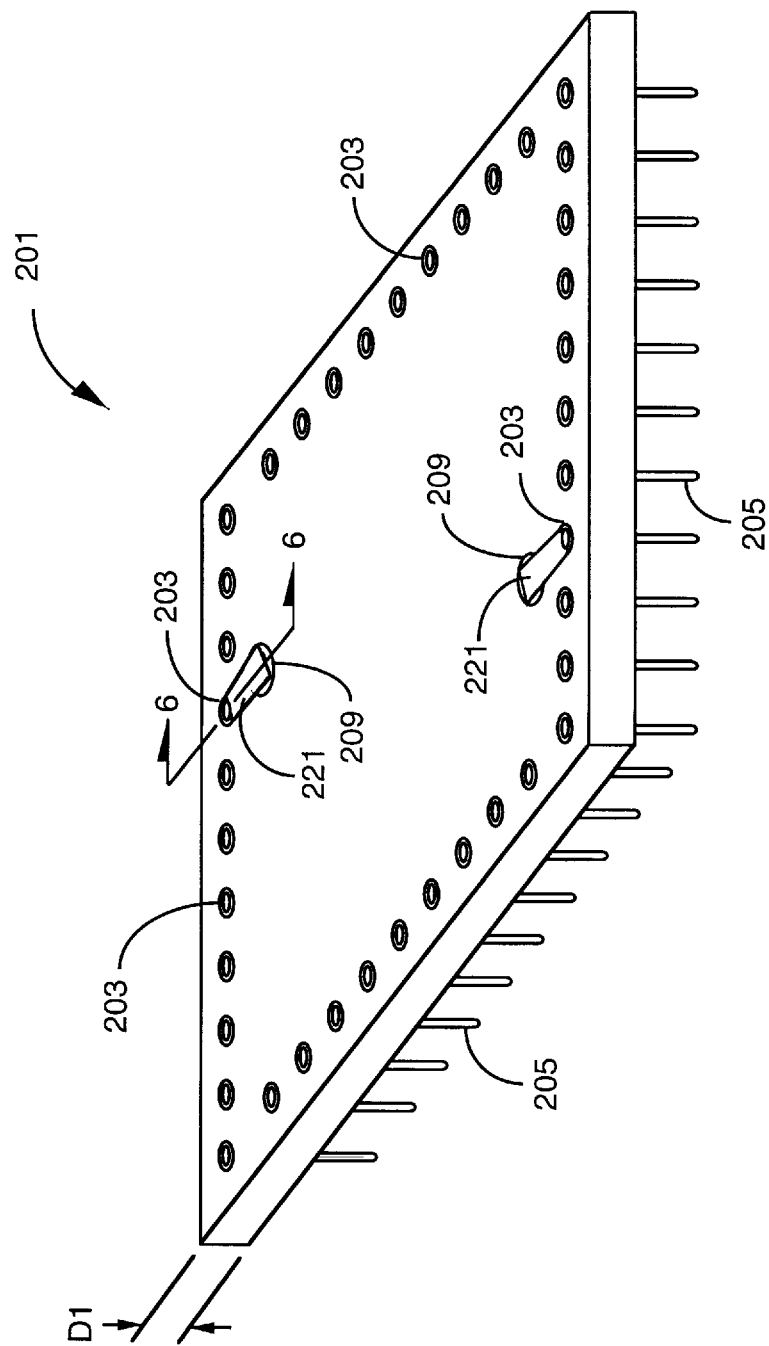
FIG. 5 is an isometric view of a Smart Receptacle according to an embodiment of the present invention.

FIG. 5 is an isometric view of a Smart Receptacle 201 according to one embodiment of the present invention. As is known in the art, a receptacle is typically provided to adapt a test socket to a load board in a manner that allows the test socket to be interchangeable. The plated through-holes in a load board are not generally suitable for simply engaging the pins of a test socket without soldering the test socket pins into the plated through holes. Direct connection of a test socket to a load board then, provides an assembly wherein the test socket is not easily removable to be interchangeable with other sockets.

Pins are provided on receptacles for engaging plated through holes in a load board, and soldering to the plated through holes. These pins generally relate on a one-to-one basis with leads of a socket, and may be in any one of several well-known patterns. Each pin connects to a socket aperture which extends through generally the thickness of the receptacle. Each of these socket apertures, as they are termed in this disclosure, is a female hollow pin configured to receive a male pin from a socket, and to make efficient electrical contact by friction.

In Smart Receptacle 201 of FIG. 5, each of pins 205 connects to a socket aperture 203 which extends through thickness D1 of Smart Receptacle 201. This much of the structure of the Smart Receptacle is conventional, and serves the same purpose as the equivalent structure of a conventional receptacle.

In the case of leads of a DUT that require power, as was described above in the Background section, due to multiple junctures and often necessarily small cross-section of conductive paths for power from a power supply to final connection to leads of a DUT, it has become a practice to provide load capacitors near the lead connection, with one end of the capacitor connected as close as is practical to a lead requiring power, and the other connected to ground. These load capacitors are typically and conventionally mounted between plated through holes and a ground plane on the backside of a load board; that is, the side opposite the side where a receptacle and a test socket are mounted.

In Smart Receptacle 201, extra holes 209, which are not plated through, are provided preferably adjacent to those pins requiring power, and a decoupling capacitor is placed in each hole 209. The diameter of holes 209 and the thickness D1 of the Smart Receptacle is made to accommodate the full length of the decoupling capacitors to be used. Available sizes of these capacitors is well known in the art. For example, one popular decoupling capacitor is about 0.060 inches in diameter and about 0.125 inches long. For this capacitor, a hole 209 would be provided somewhat greater in diameter than 0.060 inches, and the receptacle board would be made to a thickness D1 of about 0.125 inches.

In a preferred embodiment of the invention, the Smart Receptacle is made as a printed circuit board, for reasons that are made clear by disclosure below. Printed circuit board material and construction, however, is convenient, and not strictly required. There are other ways that Smart Receptacles according to the invention may be made.

Finally relative to FIG. 5, although it is not seen in FIG. 5, there is a ground plane (copper area) implemented on the underside of the Smart Receptacle. The purpose of the ground plane is primarily to provide grounding for decoupling capacitors mounted through the Smart Receptacle. Also, holes 209 can be provided in more than one way.

In one embodiment, a pattern of holes 209 capable of mounting a decoupling capacitor is provided such that one hole 209 is available near each socket aperture 203. Because of the generally larger diameter of holes 209 than socket apertures 203, there are, in this embodiment, fewer holes 209 than there are socket apertures 203. A hole 209, for example, may be provided adjacent to each second aperture 203. Such a hole 209 may then serve either the immediately adjacent aperture 203 or the aperture immediately to either side.

In an alternative embodiment, holes 209 are drilled or otherwise fabricated after it is determined which apertures 203 are to be tied to power. Then one hole 209 is made for each aperture 203 needing power connection.

Figure 6:
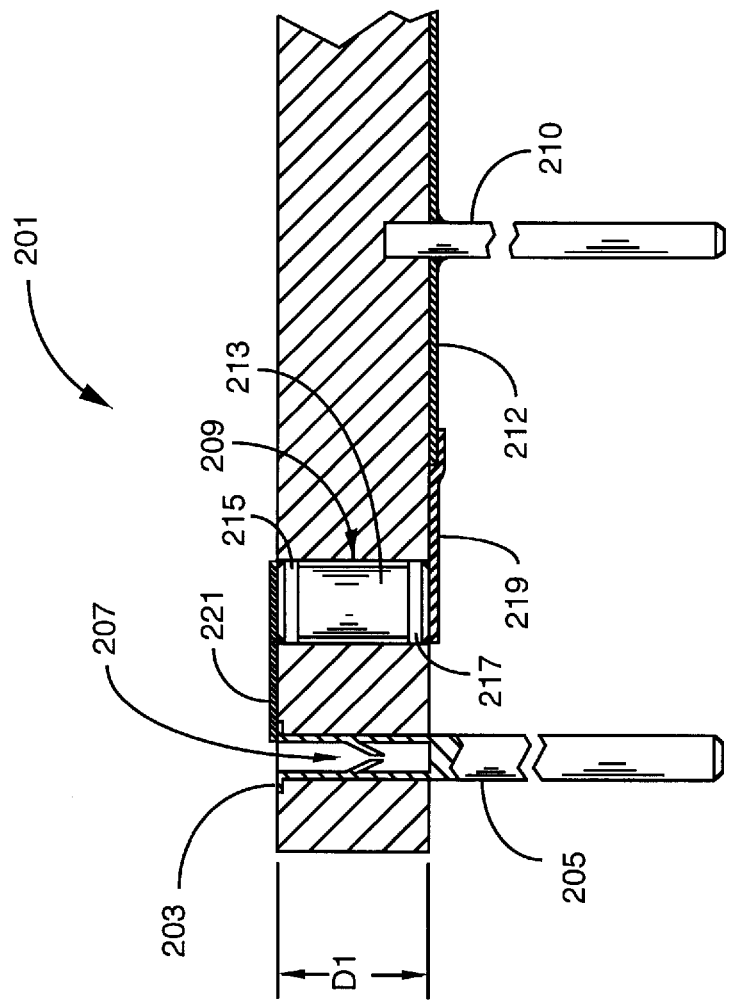
FIG. 6 is a partial cross section of the Smart Receptacle of FIG. 5 taken along section line 6—6 of FIG. 5.

FIG. 6 is a partial cross section of Smart Receptacle 201 taken along section line 6—6 to show the special nature of the socket apertures, pins, and location of decoupling capacitors in holes 209. Socket aperture 203 has a resilient conical structure 207 which assures that pins from a test socket may be engaged by friction alone while providing intimate electrical contact. This structure of pins 205 and socket apertures 203 is well-known in the art.

In the Smart Receptacle according to the embodiment of FIG. 6, extra pins such as pin 210, are provided to bring ground from the load board to a ground plane 212 on the underside of the Smart Receptacle. There are, for a Smart Receptacle according to embodiments of the invention, typically more than one such ground pin, so the ground plane provided is a hearty ground connection.

In FIG. 5, two socket apertures 203 are assumed, for purposes of illustrating this embodiment of the invention, to require power. A single through-hole 209 is shown near each of the socket apertures 203 requiring power, although there may be more holes 209, as described above. A decoupling capacitor 213, which has conductive bands 215 and 217 at the ends, is inserted in through-hole 209.

To connect decoupling capacitor 213 to socket aperture 203 and to ground plane 212, a jumper 219 is provided to ground plane 212 on the underside, and a jumper 221 is provided to the adjacent socket aperture 203 on the top side. The power connection of cap 213 is thus made at the top side of Smart Receptacle 201 rather than at the underside of the load board, closer to the power lead of a DUT by about 0.5 inches, which is a significant improvement over the prior art. The ground connection is made to a robust ground plane on the back of the Smart Receptacle.

The ground plane can be larger than shown, with the through-holes 209 passing through the ground plane. In this case the connection from the ground end of a decoupling capacitor to the ground plane can be made by soldering at the end of hole 209 to the ground plane, or by applying a thick-film end cap at that position. Also, rather than thick-film jumpers 221 from the upper end of a decoupling capacitor to apertures 203, a PCB trace might be provided from each aperture 203 to each adjacent hole 209. The, when a decoupling capacitor is inserted, it is needed only to solder at the upper end of the cap to the trace, or to apply a dot of thick-film conductive polymer according to the present invention.

In addition to ground jumpers for decoupling capacitors, those pins requiring ground connection may optionally be jumpered on the underside of Smart Receptacle 201 to ground plane 212 rather than being jumpered on load board 129 as previously described.

Jumpers 219 and 221 for Smart Receptacle 201 may be made in a number of ways, just as load boards are customized by jumpers in a number of ways, such as by hand soldering the connections or soldering wires between the connection points. In a preferred embodiment, however, an unfinished Smart Receptacle is placed on a holding fixture, a template is registered to the same fixture, and the jumpers are made by urging conductive polymer into openings in the template strategically placed to make the jumpers. The apparatus and procedure in this embodiment is very similar to that described above for customized load boards with reference to FIGS. 4A and 4B.

The Smart Receptacle in the embodiment shown in FIGS. 5 and 6 is preferably used with customized load boards of the type described above, wherein jumpers to power and ground are made by applying conductive epoxy with a template. Such a Smart Receptacle, however, may also be used independently, with load boards that are fully customized in the PCB manufacturing process, or customized by solder or a wire jumper on a more generic board.

Figure 7:
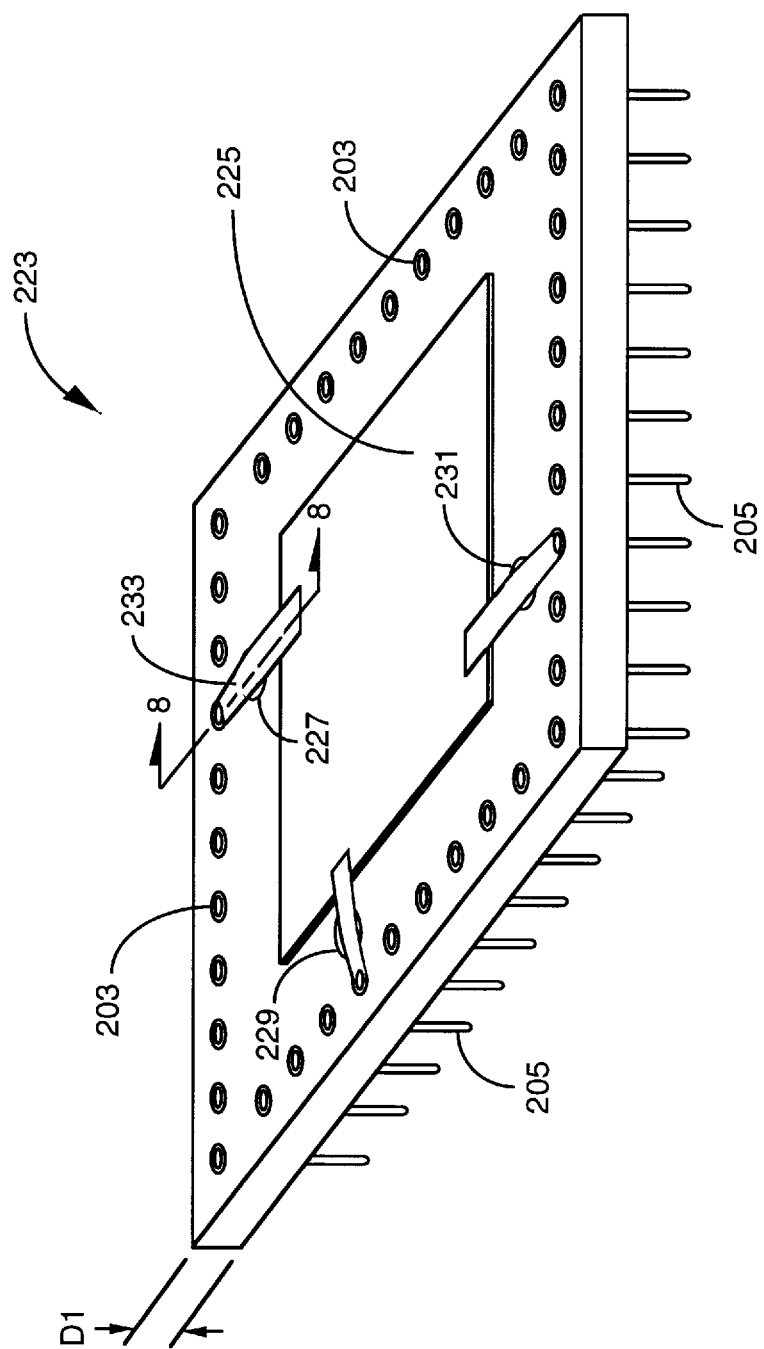
FIG. 7 is an isometric view of a Smart Receptacle according to another embodiment of the present invention.

In an alternative embodiment a Smart Receptacle 223 is shown in FIG. 7 having a power plane 225 on the top side of the Smart Receptacle 223, and connected to power via extra pins through the thickness of Smart Receptacle 223 (not shown in FIG. 7, which power pins connect to through-holes provided in the load board that are connected to the power plane of the load board. In this embodiment, for illustration, three leads are assumed to require power. Decoupling capacitor holes 227, 229, and 231 are provided adjacent to the socket apertures 203 for these power leads, between the socket apertures 203 and the power plane 225.

Figure 8:
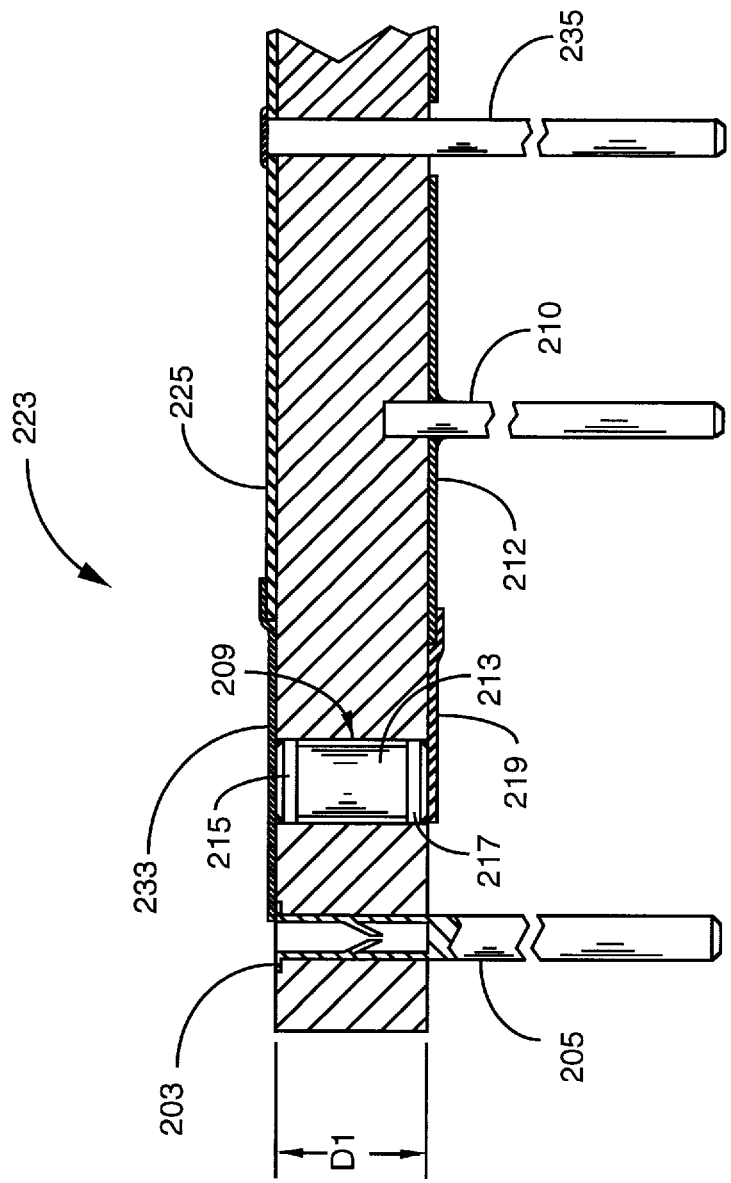
FIG. 8 is a partial section elevation view of the Smart Receptacle of FIG. 7 taken along section line 8—8 of FIG. 7.

FIG. 8 is a cross section of Smart Receptacle 223 of FIG. 7 taken along section line 8—8 of FIG. 7. Elements and dimensions common to the structure of FIG. 6 are given common element numbers for convenience. For example, pins 205 connect to socket apertures 203 as in Smart Receptacle 201 (FIG. 6). Also, jumpers 219, preferably made by the thick-film template technique of the present invention, connect from ground plane 212 to one end of decoupling capacitors 213 in holes such as hole 227 shown.

Power plane 225 connects to power pins on load board 129 (not seen in FIG. 8) by pins 235 which pass through the thickness of Smart Receptacle 223 at positions where ground plane 212 has an opening. There may be several pin connections for power plane 225, to assure a robust power plane.

In Smart Receptacle 223 jumpers 233 are made from apertures 203 across one end of decoupling capacitors 213 and further to power plane 225. These jumpers may be made by conventional processes, or they may be made by the thick-film technique of the present invention with a template. Additionally, ground-only jumpers for apertures 203 requiring ground connection are made by jumpers on the underside of Smart Receptacle 223 between pins 205 and ground plane 212. These jumpers may also be made conventionally, or preferably by the thick-film technique of the present invention.

A smart receptacle according to various embodiments of the present invention, then, may provide no customizing function, and the load board is customized completely, or may provide a part of or all of the customizing function. By providing ground-only jumpers, a Smart Receptacle provides a portion of the customizing function, and by having a power plane and a ground plane, and jumpering to appropriate pins (apertures), all of the needed customizing may be done on the Smart Receptacle. In this case, a generic load board may be provided for many types of ICs having common pin geometry.

As was described above for Smart Receptacle 201, Smart Receptacle 223 may also be designed such that jumpers required may be relatively long and complex, like traces on a printed circuit board. Such traces are achievable by the thick-film technique of the present invention.

In test systems like those described above, both conventionally and according to preferred embodiments of the present invention, there are lines other than power, ground, and signals to a socket. These are Sense lines, which are provided to monitor voltages at power and ground points near the leads (if possible) of a DUT. In a further embodiment of the present invention, sense lines for power and ground are brought to the Smart Receptacle and connected to the power and ground planes of the receptacle, thus bringing sensing closer to the DUT than is possible in current art.

It will be apparent to those with skill in the art that there are many alterations that may be made in the embodiments of the invention described herein without departing from the spirit and scope of the invention. For example, there are many alternatives for design of load boards to provide a board to which jumpering may be applied according to the spirit and scope of the present invention. Some designs provide a more convenient starting point than do others.

As another example, there are many formulations of conductive materials that might be used, and there are many variations in geometry of jumpers that might be made. There are similarly many variations that might be made in templates for the unique thick-film process of the invention, and there are many variations in the apparatus that might be used for registering templates to load boards, Smart Receptacles, and to other kinds of printed circuit boards within the spirit and scope of the invention. In point of fact, the provision of traces and jumpers on boards by registering a template and applying thick-film conductive polymer material is unique in the art.

There are, as will be apparent to those with skill in the art, many other variations that might be made in apparatus and methods described without departing from the spirit and scope of the invention.

What is claimed is:

1. A method for customizing a printed circuit board (PCB), comprising steps of:
   (a) registering a template to the PCB, the template having an opening in registration defining a position between a first and a second conductive land on the PCB where a conductive trace or jumper is desired;
   (b) marking through the opening in the template with a marking tool;
   (c) removing the template, leaving the PCB marked at a position where a jumper is wanted;
   (d) placing a conductive foil strip at the position marked; and
   (e) welding the conductive foil strip to the first and the second conductive lands.

2. The method of claim 1 wherein multiple jumper positions are marked and multiple jumpers are welded.

3. The method of claim 1 wherein a weld is accomplished by passing an electrical current between two electrodes spaced apart in a first direction and both contacting the foil strip over a conductive land, the electrical current passing through the foil strip and a portion of a surface of one of the conductive lands.

4. The method of claim 3 wherein the spaced-apart electrodes comprise a weld tip having a length dimension in the direction between the electrodes and a width at right angles to the length, the length being greater than the width, and wherein welds are made with the length of the weld tip at substantially ninety degrees to the length direction of the jumper strip to conserve land space where welds are accomplished.

5. A method for customizing a printed circuit board (PCB), comprising steps of:
   (a) forming jumper strips as isolated regions of conductive material on a one-piece backing material, the isolated regions affixed to the backing material by a first adhesive, and having a second adhesive stronger than the first adhesive on a surface of the jumper strips opposite the backing material;
   (b) placing the backing material over the PCB with the jumper strips at positions where jumpers are desired;
   (c) pressing the jumper strips onto the PCB such that the second adhesive affixes the jumper strips to the PCB; and
   (d) peeling away the backing material, leaving the jumper strips on the PCB.

6. The method of claim 5 wherein the conductive material is gold.

7. The method of claim 5 wherein the isolated regions of conductive material are formed on the backing material by an automatic machine responding to software including data on jumper strip positions desired on the PCB.

8. A method for preparing a printed circuit board (PCB) for application of jumpers between lands on the PCB, comprising steps of:
   (a) forming jumper strip stencils as isolated regions of material on a one-piece backing material, the isolated regions affixed to the backing material by a first adhesive;
   (b) placing the backing material over a silkscreen;
   (c) pressing the jumper strip stencils onto the silkscreen such that the stencils adhere to the silkscreen;
   (d) peeling away the backing material, leaving the stencils on the silkscreen;
   (e) positioning the silkscreen on the PCB such that the stencils on the silkscreen cover regions where jumpers are desired;
   (f) applying a peelable solder mask material to the silkscreen;
   (h) removing the silkscreen, leaving the regions covered by the stencils exposed with no solder mask material; and
   (i) curing the peelable solder mask material.

9. The method of claim 8 further comprising steps for:
   (j) rendering the surface of the PCB conductive in the regions exposed through the peelable solder mask material; and
   (k) plating the regions rendered conductive to form conductive jumpers in the exposed regions.

10. The method of claim 9 wherein the plating material is gold.

11. The method of claim 9 wherein the rendering conductive is accomplished by sputtering a conductive material in the exposed regions.

* * * * *